(12) United States Patent
Muramatsu et al.

(10) Patent No.: US 11,370,970 B2
(45) Date of Patent: *Jun. 28, 2022

(54) OPTICALLY ANISOTROPIC FILM, OPTICAL FILM, POLARIZING PLATE, AND IMAGE DISPLAY DEVICE

(71) Applicant: FUJIFILM Corporation, Tokyo (JP)

(72) Inventors: Ayako Muramatsu, Kanagawa (JP); Ryo Satake, Kanagawa (JP); Mayumi Nojiri, Kanagawa (JP); Aiko Yoshida, Kanagawa (JP); Keita Takahashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/991,202

(22) Filed: Aug. 12, 2020

(65) Prior Publication Data

US 2020/0369960 A1 Nov. 26, 2020

Related U.S. Application Data

(63) Continuation of application No. PCT/JP2019/005369, filed on Feb. 14, 2019.

(30) Foreign Application Priority Data

Feb. 14, 2018 (JP) .............................. JP2018-023821

(51) Int. Cl.
*C09K 19/38* (2006.01)
*G02B 5/30* (2006.01)
(Continued)

(52) U.S. Cl.
CPC .......... *C09K 19/3861* (2013.01); *C09K 19/04* (2013.01); *C09K 19/34* (2013.01);
(Continued)

(58) Field of Classification Search
CPC .... C09K 19/3861; C09K 19/34; C09K 19/04; C09K 2019/0448; C09K 2323/00;
(Continued)

(56) References Cited

U.S. PATENT DOCUMENTS

| 2010/0045901 A1 | 2/2010 | Uehira et al. |
| 2015/0175564 A1 | 6/2015 | Sakamoto et al. |

(Continued)

FOREIGN PATENT DOCUMENTS

| CN | 101558054 A | 10/2009 |
| CN | 107209314 A | 9/2017 |

(Continued)

OTHER PUBLICATIONS

International Search Report issued in PCT/JP2019/005369 dated May 21, 2019.

(Continued)

*Primary Examiner* — Ruiyun Zhang
(74) *Attorney, Agent, or Firm* — Edwards Neils LLC; Jean C. Edwards, Esq.

(57) ABSTRACT

Provided are an optically anisotropic film which has excellent moisture-heat resistance and can have a reduction in the thickness, an optical film, a polarizing plate, and an image display device. The optically anisotropic film is obtained by polymerizing a polymerizable liquid crystal composition, in which the polymerizable liquid crystal composition contains a polymerizable liquid crystal compound represented by Formula (1): $L^1\text{-}SP^1\text{-}(E^3\text{-}A^1)_m\text{-}E^1\text{-}G^1\text{-}D^1\text{-}Ar^1\text{-}D^2\text{-}G^2\text{-}E^2\text{-}(A^2\text{-}E^4)_n\text{-}SP^2\text{-}L^2$ and a polymerizable liquid crystal compound represented by Formula (2): $L^1\text{-}SP^1\text{-}(E^3\text{-}A^1)_m\text{-}E^1\text{-}G^1\text{-}D^1\text{-}Ar^2\text{-}D^2\text{-}G^2\text{-}E^2\text{-}(A^2\text{-}E^4)_n\text{-}SP^2\text{-}L^2$, and the optically anisotropic film satisfies Formula (3): $Re(450)/Re(550)<1$ or (Continued)

Formula (4): Rth(450)/Rth(550)<1, and has a degree of alignment as measured by Raman spectroscopy of 0.4 or more.

19 Claims, 2 Drawing Sheets

(51) Int. Cl.
    *C09K 19/34*     (2006.01)
    *C09K 19/04*     (2006.01)
    *G02F 1/1335*     (2006.01)
    *H01L 51/52*     (2006.01)
    *G02F 1/13363*     (2006.01)

(52) U.S. Cl.
    CPC ......... G02B 5/3016 (2013.01); G02B 5/3083 (2013.01); *C09K 2019/0448* (2013.01); *C09K 2323/00* (2020.08); *C09K 2323/03* (2020.08); *C09K 2323/035* (2020.08); *G02F 1/133528* (2013.01); *G02F 1/133633* (2021.01); *H01L 51/5281* (2013.01)

(58) Field of Classification Search
    CPC .......... C09K 2323/03; C09K 2323/035; G02B 5/035; G02B 5/3016; G02F 1/133633; G02F 1/133528
    USPC .................. 428/1.1, 1.3, 1.33; 349/117, 194
    See application file for complete search history.

(56) References Cited

U.S. PATENT DOCUMENTS

| | | |
|---|---|---|
| 2017/0329063 A1 | 11/2017 | Sakai et al. |
| 2018/0201701 A1 | 7/2018 | Muramatsu et al. |
| 2019/0023986 A1 | 1/2019 | Yoshinari et al. |
| 2020/0013835 A1* | 1/2020 | Muramatsu ......... H01L 51/0035 |
| 2020/0079885 A1 | 3/2020 | Tamura et al. |

FOREIGN PATENT DOCUMENTS

| | | | | |
|---|---|---|---|---|
| CN | 110637038 A | 12/2019 | | |
| JP | 2008-273925 A | 11/2008 | | |
| JP | 2009-242717 A | 10/2009 | | |
| JP | 2010-031223 A | 2/2010 | | |
| JP | 2014-077068 A | 5/2014 | | |
| JP | 2016-081035 A | 5/2016 | | |
| WO | 2014/010325 A1 | 1/2014 | | |
| WO | 2016/125839 A1 | 8/2016 | | |
| WO | 2017/057545 A1 | 4/2017 | | |
| WO | 2017/170443 A1 | 10/2017 | | |
| WO | WO-2018012390 A1 * | 1/2018 | ......... | G02F 1/13363 |
| WO | WO-2018174015 A1 * | 9/2018 | ......... | H01L 27/3232 |
| WO | 2018/216812 A1 | 11/2018 | | |

OTHER PUBLICATIONS

Written Opinion issued in PCT/JP2019/005369 dated May 21, 2019.
International Preliminary Report on Patentability completed by WIPO dated Aug. 18, 2020 in connection with International Patent Application No. PCT/JP2019/005369.
Office Action, issued by the Japanese Patent Office dated Jan. 19, 2021, in connection with Japanese Patent Application No. 2020-500559.
Office Action, which was issued by the State Intellectual Property Office dated Oct. 11, 2021, in connection with Chinese Patent Application No. 201980013140.3.
Office Action, which was issued by the Korean Intellectual Property Office dated Feb. 16, 2022, in connection with Korean Patent Application No. 10-2020-7022846.

* cited by examiner

OPTICALLY ANISOTROPIC FILM, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2019/005369 filed on Feb. 14, 2019, which was published under PCT Article 21(2) in Japanese, and which claims priority under 35 U.S.C. § 119(a) to Japanese Patent Application No. 2018-023821 filed on Feb. 14, 2018. The above applications are hereby expressly incorporated by reference, in their entirety, into the present application.

BACKGROUND OF THE INVENTION

1. Field of the Invention

The present invention relates to an optically anisotropic film, an optical film, a polarizing plate, and an image display device.

2. Description of the Related Art

A polymerizable compound exhibiting reciprocal wavelength dispersibility enables, for example, accurate conversion of light ray wavelengths over a wide wavelength range and reduction in the thickness of a phase difference film due to its high refractive index, and therefore, it has been actively studied.

Furthermore, for the polymerizable compound exhibiting reciprocal wavelength dispersibility, T-type molecular design guidelines have generally been adapted, and thus, it has been required to decrease the wavelength of the major axis of the molecule and increase the wavelength of the minor axis positioned at the center of the molecule.

In this regard, it is known that a cycloalkylene skeleton having no absorption wavelength is used for connection between a skeleton of the minor axis positioned at the center of the molecule (hereinafter also referred to as a "reciprocal wavelength dispersion expressing part") and the major axis of the molecule (see, for example, JP2010-031223A, WO2014/010325A, and JP2016-081035A).

SUMMARY OF THE INVENTION

In recent years, as various display devices have been developed in diversified applications, phase difference films (optically anisotropic films) have been used in severer moisture-heat environments or used in folded sheet-shaped ultra-thin display devices, but there is a growing demand for applications to use modes which have not been assumed in the related art.

The present inventors have conducted studies on polymerizable compounds exhibiting reciprocal wavelength dispersibility described in JP2010-031223A, WO2014/010325A, and JP2016-081035A, and have thus found that the structure of a substituent contained in a reciprocal wavelength dispersion expressing part gives an influence on the moisture-heat resistance of an optically anisotropic film thus formed, but have clarified that in a case where the structure of a substituent for improving the moisture-heat resistance is adopted, an expressing property ($\Delta n = Re/d$) for a retardation (Re) per thickness of an optically anisotropic film thus formed is reduced due to the structure, and it becomes difficult to reduce the thickness.

Therefore, an object of the present invention is to provide an optically anisotropic film which has excellent moisture-heat resistance and can have a reduction in the thickness, an optical film, a polarizing plate, and an image display device.

The present inventors have conducted intensive studies to accomplish the object, and as a result, they have found that by using an polymerizable liquid crystal composition in which a polymerizable liquid crystal compound having a predetermined structure is blended with a polymerizable liquid crystal compound having a predetermined substituent in a reciprocal wavelength dispersion expressing part, the moisture-heat resistance of an optically anisotropic film thus formed is improved and the thickness can be reduced, thereby completed the present invention.

That is, the present inventors have found that the object can be accomplished by the following configurations.

[1] An optically anisotropic film obtained by polymerizing a polymerizable liquid crystal composition, in which the polymerizable liquid crystal composition contains a polymerizable liquid crystal compound represented by Formula (1) which will be described later and a polymerizable liquid crystal compound represented by Formula (2) which will be described later, and the optically anisotropic film satisfies Formula (3) or (4) which will be described later and has a degree of alignment of 0.4 or more as measured by Raman spectroscopy.

[2] The optically anisotropic film as described in [1], in which in Formula (1) which will be described later, m is 1, $A^1$ and $G^1$ are both a cyclohexylene group which may have a substituent, and $E^1$ is a single bond, and in Formula (1) which will be described later, n is 1, $A^2$ and $G^2$ are both a cyclohexylene group which may have a substituent, and $E^2$ is a single bond.

[3] The optically anisotropic film as described in [1] or [2], in which $Ar^1$ in Formula (1) which will be described later and $Ar^2$ in Formula (2) which will be described later both represent a group represented by Formula (Ar-1) or (Ar-2) which will be described later,

[4] The optically anisotropic film as described in any one of [1] to [3], in which the total number of the rings represented by $G^1$, $G^2$, $A^1$, and $A^2$ in Formula (1) which will be described later is the same as the total number of the rings represented by $G^1$, $G^2$, $A^1$, and $A^2$ in Formula (2) which will be described later.

[5] The optically anisotropic film as described in any one of [1] to [4], in which an I/O value of the liquid crystal compound included in the polymerizable liquid crystal composition is 0.51 or less as a weighted average value.

[6] The optically anisotropic film as described in any one of [1] to [5], in which a pKa value of a diphenol compound represented by HO—$Ar^1$—OH derived from the structure of $Ar^1$ in Formula (1) which will be described later is less than 11.

[7] The optically anisotropic film as described in any one of [1] to [6], in which the polymerizable liquid crystal composition does not correspond to any of Formulae (1) and (2) which will be described later and contains a polymerizable compound having two or more polymerizable groups.

[8] The optically anisotropic film as described in any one of [1] to [7], in which the polymerizable liquid crystal composition contains a polymerization initiator,

[9] The optically anisotropic film as described in [8], in which the polymerization initiator is an oxime-type polymerization initiator.

[10] The optically anisotropic film as described in any one of [1] to [9],
wherein the optically anisotropic film is a positive A-plate or a positive C-plate.

[11] The optically anisotropic film as described in any one of [1] to [9],
in which the optically anisotropic film is a positive A-plate and has an Re(550) of 100 to 180 nm.

[12] An optical film comprising the optically anisotropic film as described in any one of [1] to [11].

[13] A polarizing plate comprising:
the optical film as described in [12]; and
a polarizer,

[14] An image display device comprising the optical film as described in [12] or the polarizing plate as described in [13].

According to the present invention, it is possible to provide an optically anisotropic film which has excellent moisture-heat resistance and can have a reduction in the thickness, an optical film, a polarizing plate, and an image display device.

DESCRIPTION OF THE PREFERRED EMBODIMENTS

Figure 1A:
FIG. 1A is a schematic cross-sectional view showing an example of an optically anisotropic film of an embodiment of the present invention.

Hereinafter, the present invention will be described in detail.

Descriptions on the constitutional requirements which will be described later are made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit value and the upper limit value, respectively.

In addition, in the present specification, the bonding direction of a divalent group (for example, —O—CO—) as noted is not particularly limited unless the bonding position is specified, and for example, in a case where $D^1$ in Formula (1) which will be described later is —CO—O—, $D^1$ may be either *1-CO—O-*2 or *1-O—CO-*2, in which *1 represents a bonding position to the $Ar^1$ side and *2 represents a bonding position to $G^1$.

In addition, in the present specification, angles (for example, angles of "90°") and relationships thereof (for example, "orthogonal", "parallel", and "intersecting at 45°") include error ranges accepted in the technical field to which the present invention belongs. For example, the angle means an angle in a range of less than ±10° of a rigorous angle, and the error from the rigorous angle is preferably 5° or less, and more preferably 3° or less.

[Optically Anisotropic Film]

An optically anisotropic film of an embodiment of the present invention is an optically anisotropic film obtained by polymerizing a polymerizable liquid crystal composition.

Furthermore, in the present invention, the polymerizable liquid crystal composition contains a polymerizable liquid crystal compound represented by Formula (1) and a polymerizable liquid crystal compound represented by Formula (2).

In addition, in the present invention, the optically anisotropic film satisfies Formula (3) or (4) which will be described later and has a degree of alignment of 0.4 or more as measured by Raman spectroscopy.

In the present invention, by using an polymerizable liquid crystal composition (hereinafter formally referred to as a "polymerizable liquid crystal composition of the embodiment of the present invention") in which the polymerizable liquid crystal compound represented by Formula (2) which will be described later (hereinafter also simply referred to as the "polymerizable liquid crystal compound (2)") is blended with the polymerizable liquid crystal compound represented by Formula (1) which will be described later (hereinafter simply referred to as the "polymerizable liquid crystal compound (1)"), as described above, the moisture-heat resistance of an optically anisotropic film thus formed is improved and the thickness can be reduced.

A reason therefor is not specifically clear, but is presumed to be as follows by the present inventors.

First, it is known that the aromatic rings constituting the reciprocal wavelength dispersion expressing part easily interact with each other due to a so-called electron-deficient state, but it is considered that in a case where only the polymerizable liquid crystal compound (1) is used, the interaction is weakened by a substituent having a large van der Waals volume contained in the reciprocal wavelength dispersion expressing part.

As a result, it is considered that in a case where the polymerizable liquid crystal compound (2) having a substituent having a small van der Waals volume is used in combination with the polymerizable liquid crystal compound (1), the polymerizable liquid crystal compound (2) invades into a gap between the polymerizable liquid crystal compounds (1) to reinforce the interaction, and thus, a high degree of alignment order which is higher than a weighted average value of the mutual degrees of alignment (degrees of alignment order) can be achieved.

Furthermore, it is presumed that as the degree of alignment of the optically anisotropic film is higher, the expressing property for retardation per thickness is not only enhanced but the liquid crystal compounds are also closely aligned, whereby invasion and diffusion of deterioration substances into a film are suppressed and the moisture-heat resistance is improved.

The optically anisotropic film of the embodiment of the present invention may be either a single layer or a multilayer as long as it includes at least one layer of optically anisotropic films obtained by polymerizing the polymerizable liquid crystal composition of the embodiment of the present invention.

Figure 1B:
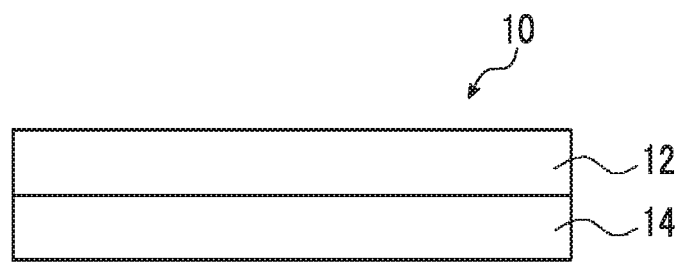
FIG. 1B is a schematic cross-sectional view showing another example of the optically anisotropic film of the embodiment of the present invention.

FIG. 1A and FIG. 1B are each a schematic cross-sectional view showing an example of the optically anisotropic film of the embodiment of the present invention. Further, the drawings in the present invention are schematic views, and the thickness relationship, the positional relationship, and the like of the respective layers do not always match the actual ones.

An optically anisotropic film 10 shown in FIG. 1A is a film with a single-layer structure having a positive A-plate 12.

Furthermore, an optically anisotropic film 10 shown in FIG. 1B is a multilayer film having a positive A-plate 12 and a positive C-plate 14. Incidentally, each of the positive A-plate 12 and the positive C-plate 14 preferably has a single-layer structure.

In addition, in the optically anisotropic film 10 shown in FIG. 1B, at least the positive A-plate 12 of the positive A-plate 12 and the positive C-plate 14 is preferably an optically anisotropic film obtained by polymerizing the polymerizable liquid crystal composition of the embodiment of the present invention.

Hereinafter, the respective components of the polymerizable liquid crystal composition of the embodiment of the present invention will be described in detail.

[Polymerizable Liquid Crystal Compound (1)]

The polymerizable liquid crystal compound (1) contained in the polymerizable liquid crystal composition of the embodiment of the present invention is a polymerizable liquid crystal compound represented by Formula (1).

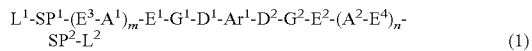
$L^1$-$SP^1$-($E^3$-$A^1$)$_m$-$E^1$-$G^1$-$D^1$-$Ar^1$-$D^2$-$G^2$-$E^2$-($A^2$-$E^4$)$_n$-$SP^2$-$L^2$ (1)

In addition, in Formula (1), $D^1$, $D^2$, $E^1$, $E^2$, $E^3$, and $E^4$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

Furthermore, in Formula (1), $G^1$ and $G^2$ each independently represent a divalent alicyclic hydrocarbon group having 5 to 8 carbon atoms, which may have a substituent, and one or more of —$CH_2$—'s constituting the alicyclic hydrocarbon group may be substituted with —O—, —S—, or —NH—.

In Formula (1), $A^1$ and $A^2$ each independently represent a divalent aromatic hydrocarbon group having 6 to 12 carbon atoms or a divalent alicyclic hydrocarbon group having 5 to 8 carbon atoms, each of which may have a substituent, and one or more of —$CH_2$—'s constituting the alicyclic hydrocarbon group may be substituted with —O—, —S—, or —NH—.

Incidentally, in Formula (1), $SP^1$ and $SP^2$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent.

Furthermore, in Formula (1), $L^1$ and $L^2$ each independently represent a monovalent organic group, and at least one of $L^1$ or $L^2$ represents a polymerizable group. It should be noted that in a case where $Ar^1$ or $Ar^2$ is an aromatic ring represented by Formula (Ar-3), at least one of $L^1$ or $L^2$, or $L^3$ or $L^4$ in Formula (Ar-3) represents a polymerizable group.

Moreover, in Formula (1), m represents an integer of 0 to 2, and in a case where m is 2, a plurality of $E^3$'s may be the same as or different from each other and a plurality of $A^1$'s may be the same as or different from each other.

In addition, in Formula (1), n represents an integer of 0 to 2, and in a case where n is 2, a plurality of $E^4$'s may be the same as or different from each other and a plurality of $A^2$'s may be the same as or different from each other.

In Formula (1), the divalent alicyclic hydrocarbon group having 5 to 8 carbon atoms represented by each of $G^1$ and $G^2$ is preferably a 5- or 6-membered ring. Further, the alicyclic hydrocarbon group may be saturated or unsaturated, but is preferably a saturated alicyclic hydrocarbon group. With regard to the divalent alicyclic hydrocarbon group represented by each of $G^1$ and $G^2$, reference can be made to, for example, the description in paragraph [0078] of JP2012-021068A, the contents of which are hereby incorporated by reference.

Among those, a cyclohexylene group (cyclohexane ring) is preferable, a 1,4-cyclohexylene group is more preferable, and a trans-1,4-cyclohexylene group is still more preferable.

In addition, in Formula (1), examples of the substituent which may be contained in the divalent alicyclic hydrocarbon group having 5 to 8 carbon atoms represented by each of $G^1$ and $G^2$ include the same ones as the substituents which may be contained in $Y^1$ in Formula (Ar-1).

In Formula (1), examples of the divalent aromatic hydrocarbon group having 6 to 12 carbon atoms represented by each of $A^1$ and $A^2$ include a 1,2-phenylene group, a 1,3-phenylene group, a 1,4-phenylene group, a 1,4-naphthylene group, a 1,5-naphthylene group, and a 2,6-naphthylene group, and among these, the 1,4-phenylene group is preferable, and the trans-1,4-phenylene group is more preferable.

In addition, examples of the divalent alicyclic hydrocarbon group having 5 to 8 carbon atoms represented by each of $A^1$ and $A^2$ include the same ones as those described for $G^1$ and $G^2$ in Formula (1), and the divalent alicyclic hydrocarbon group is preferably a cyclohexylene group (cyclohexane ring), more preferably a 1,4-cyclohexylene group, and still more preferably a trans-1,4-cyclohexylene group.

Suitable examples of the linear or branched alkylene group having 1 to 12 carbon atoms represented by each of $SP^1$ and $SP^2$ in Formula (1) include a methylene group, an ethylene group, a propylene group, a butylene group, a pentylene group, a hexylene group, a methylhexylene group, and a heptylene group. Incidentally, $SP^1$ and $SP^2$ may be a divalent linking group in which one or more of —$CH_2$—'s constituting the linear or branched alkylene group having 1 to 12 carbon atoms are substituted with —O—, —S—, —NH—, —N(Q)-, or —CO—, as described above, and examples of the substituent represented by Q include the same ones as the substituents which may be contained in $Y^1$ in Formula (Ar-1).

In Formula (1), examples of the monovalent organic group represented by each of $L^1$ and $L^2$ include an alkyl group, an aryl group, and a heteroaryl group. The alkyl group may be linear, branched, or cyclic, but is preferably linear. The number of carbon atoms of the alkyl group is preferably 1 to 30, more preferably 1 to 20, and still more preferably 1 to 10. Further, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatoms constituting the heteroaryl group is preferably a nitrogen atom, a sulfur atom, or an oxygen atom. The number of carbon atoms of the heteroaryl group is preferably 6 to 18, and more preferably 6 to 12. In addition, the alkyl group, the aryl group, and the heteroaryl group may be unsubstituted or have a substituent. Examples of the substituent include the same ones as the substituents which may be contained in $Y^1$ in Formula (Ar-1) which will be described later.

On the other hand, in Formula (1), the polymerizable group represented by at least one of $L^1$ or $L^2$ is not particularly limited, but is preferably a polymerizable group which is radically polymerizable or cationically polymerizable.

A generally known radically polymerizable group can be used as the radically polymerizable group, and suitable examples thereof include an acryloyl group and a methacryloyl group. In this case, it is known that the acryloyl group generally has a high polymerization rate, and from the viewpoint of improvement of productivity, the acryloyl group is preferable but the methacryloyl group can also be used in the same manner as the polymerizable group.

A generally known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and an epoxy group, an oxetanyl group, or the vinyloxy group is particularly preferable.

Particularly preferred examples of the polymerizable group include the following groups.

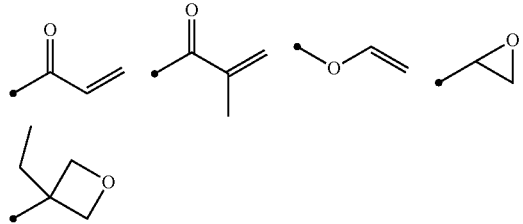

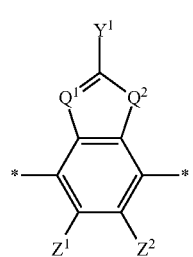

In Formula (1), for a reason that the moisture-heat resistance is improved, $L^1$ and L2 in Formula (1) are each preferably a polymerizable group, and are preferably an acryloyl group or a methacryloyl group.

On the other hand, in Formula (1), $Ar^1$ represents any aromatic ring selected from the group consisting of groups represented by Formulae (Ar-1) to (Ar-5). Further, in Formulae (Ar-1) to (Ar-5), * represents a bonding position to $D^1$ or $D^2$ in Formula (1).

(Ar-1)

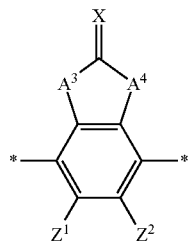

(Ar-2)

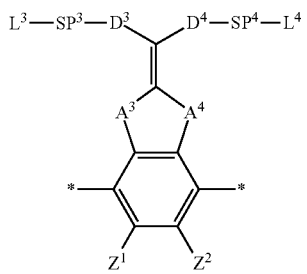

(Ar-3)

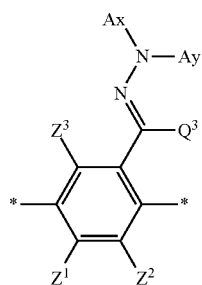

(Ar-4)

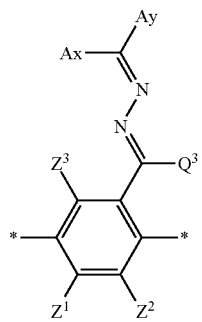

(Ar-5)

Here, in Formula (Ar-1), $Q^1$ represents N or CH, $Q^2$ represents —S—, —O—, or —N($R^5$)—, $R^5$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, each of which may have a substituent.

Specific examples of the alkyl group having 1 to 6 carbon atoms represented by $R^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include aryl groups such as a phenyl group, a 2,6-ethylphenyl group, and a naphthyl group.

Examples of the aromatic heterocyclic group having 3 to 12 carbon atoms represented by $Y^1$ include heteroaryl groups such as a thienyl group, a thiazolyl group, a furyl group, and a pyridyl group.

Furthermore, examples of the substituent which may be contained in $Y^1$ include an alkyl group, an alkoxy group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxy ethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and among these, the fluorine atom or the chlorine atom is preferable.

In addition, in Formulae (Ar-1) to (Ar-5), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$OR^6$, —$NR^7R^8$, or —$SR^9$, $R^6$ to $R^9$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, and specifically, a methyl group (Me), an ethyl group, an isopropyl group, a tert-pentyl group (1,1-dimethylpropyl group), a tort-butyl group (tBu), or a 1,1-dimethyl-3,3-dimethyl-butyl group is still more preferable, and the methyl group, the ethyl group, and the tert-butyl group are particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyi group, a cyclopentadienyl group, a cyclohexadienyl group, a cyclooctadienyl group, and a cyciodecadiene; and polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1.$^{3,7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms represented by each of $R^6$ to $R^9$ include a methyl group, an ethyl group, a propyl group, an isopropyl group, an n-butyl group, an isobutyl group, a sec-butyl group, a tert-butyl group, an n-pentyl group, and an n-hexyl group.

In the present invention, at least one of $Z^1$ or $Z^2$ in $Ar^1$ in Formula (1) represents a group having a van der Waals volume of $0.3 \times 10^2$ Å$^3$ or more, and for a reason that the moisture-heat resistance is improved, it is preferable that at least one of $Z^1$ or $Z^2$ in $Ar^1$ in Formula (1) represents a group of $0.50 \times 10^2$ Å$^3$ to $1.50 \times 10^2$ Å$^3$. Further, in the present invention, the group defining the numerical value of the van der Waals volume also includes a hydrogen atom or a halogen atom.

Here, the "van der Waals volume" refers to a volume of an area occupied by the van der Waals sphere based on the van der Waals radii of atoms constituting a substituent, and is a value calculated using the values and the method described in the "Journal of Japanese Chemistry, extra number 122; "Structure Activity Relationship of Drugs (Guidelines for Drug Design and Study on Mechanism of Action," pp. 134 to 136, 1979, Nankodo". In addition, a unit of the van der Waals volume (Å$^3$) can be converted into an SI unit with 1 Å$^3$=10$^{-3}$ nm$^3$.

Examples of the substituent having a van der Waals volume of $0.3 \times 10^2$ Å$^3$ or more include —$C_2H_5$ ($0.48 \times 10^2$ Å$^3$), —$COOCH_3$ ($0.50 \times 10^2$ Å$^3$), —$COOC_2H_5$ ($0.66 \times 10^2$ Å$^3$), a tert-butyl group ($0.71 \times 10^2$ Å$^3$), —$C_3H_7$ ($0.71 \times 10^2$ Å$^3$), —$COOCH_2CH_2OC_2H_5$ ($1.04 \times 10^2$ Å$^3$), and —$COO(CH_2)_4OCH=CH_2$ ($1.49 \times 10^2$ Å$^3$). Incidentally, the numerical values in parentheses are the values of van der Waals volumes.

In addition, in Formulae (Ar-2) and (Ar-3), $A^3$ and $A^4$ each independently represent a group selected from the group consisting of —O—, —N($R^{10}$)—, —S—, and —CO—, where $R^{10}$ represents a hydrogen atom or a substituent.

Examples of the substituent represented by $R^{10}$ include the same ones as the substituents which may be contained in $Y^1$ in Formula (Ar-1).

Furthermore, in Formula (Ar-2), X represents a non-metal atom of Groups XIV to XVI to which a hydrogen atom or a substituent may be bonded.

Moreover, examples of the non-metal atom of Groups XIV to XVI represented by X include an oxygen atom, a sulfur atom, a nitrogen atom having a substituent, and a carbon atom having a substituent, and specific examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $D^3$ and $D^4$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—. $R^1$, $R^2$, $R^3$, and $R^4$ each independently represent a hydrogen atom, a fluorine atom, or an alkyl group having 1 to 4 carbon atoms.

Moreover, in Formula (Ar-3), $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent. Examples of the substituent include the same ones as the substituents which may be contained in $Y^1$ in Formula (Ar-1).

Furthermore, in Formula (Ar-3), $L^3$ and $L^4$ each independently represent a monovalent organic group, and at least one of $L^3$ or $L^4$, or $L^1$ or $L^2$ in Formula (1) represents a polymerizable group.

Examples of the monovalent organic group include the same ones as the monovalent organic groups described for $L^1$ and $L^2$ in Formula (1).

In addition, examples of the polymerizable group include the same ones as the polymerizable groups described for $L^1$ and $L^2$ in Formula (1).

Moreover, in Formulae (Ar-4) and (Ar-5), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) and (Ar-5), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom, or an alkyl group having 1 to 6 carbon atoms, which may have a substituent.

Examples of each of Ax and Ay include the ones described in paragraphs [0039] to [0095] of WO2014/010325A.

Incidentally, specific examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in Formula (Ar-1).

In the present invention, for a reason that the moisture-heat durability of the optically anisotropic film is improved, it is preferable that the polymerizable liquid crystal compound (1) represented by Formula (1) is a polymerizable liquid crystal compound in which in Formula (1), m is 1, $A^1$ and $G^1$ are both a cyclohexylene group which may have a substituent, and $E^1$ is a single bond, and in Formula (1), n is 1, $A^2$ and $G^2$ are both a cyclohexylene group which may have a substituent, and $E^2$ is a single bond.

In the present invention, for a reason that the light fastness is improved, it is preferable that the pKa value of a diphenol compound represented by HO—$Ar^1$—OH derived from the structure of Ar1 in Formula (1) is 11 or less.

Here, the pKa is a value of an acid dissociation constant in a mixed solvent having a volume ratio of tetrahydrofuran (THF)/water=6/4 at 25° C.

As a method of measuring the acid dissociation constant in the present invention, an alkali titration method described in Lectures of Experimental Chemistry, 2nd Edition, pp. 215 to 217, published by Maruzen Co., Ltd. can be used.

Suitable examples of such a polymerizable liquid crystal compound (1) include compounds represented by Formulae (1-1) to (1-10), and specifically, the compounds which have side chain structures shown in Tables 1 and 2 below as K (side chain structure Formulae (1-1) to (1-10).

Furthermore, in Tables 1 and 2 below, "*" shown in the side chain structure of K represents a bonding position to an aromatic ring.

In addition, in the side chain structures shown in 1-2 in Table 1 below and 2-2 in Table 2 below, a group adjacent to each of the acryloyloxy group and the methacryloyl group represents a propylene group (a group in which a methyl group is substituted with an ethylene group), and represents a mixture of position isomers in which the positions of the methyl groups are different.

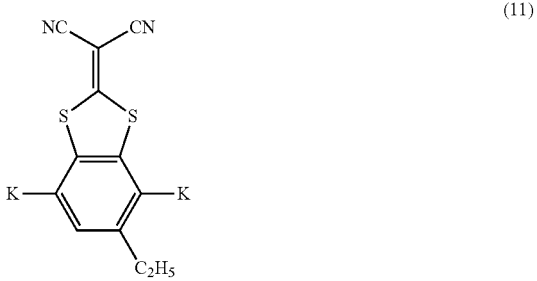

(11)

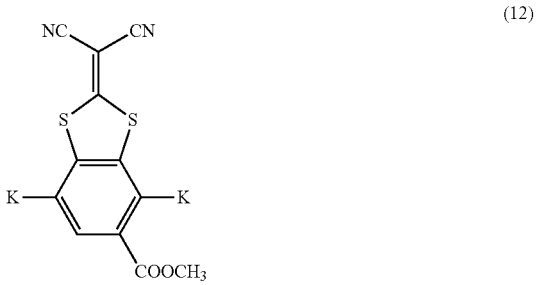

(12)

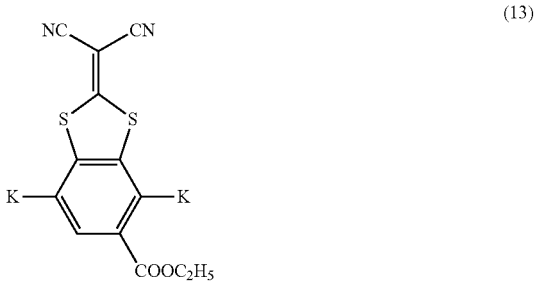

(13)

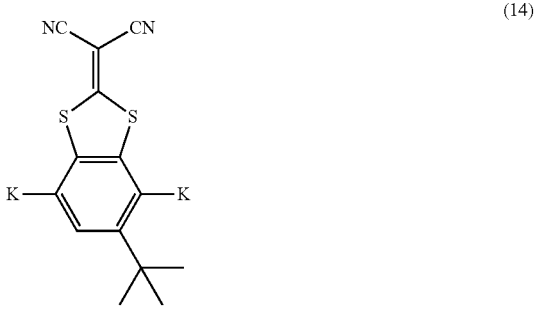

(14)

-continued
(15)
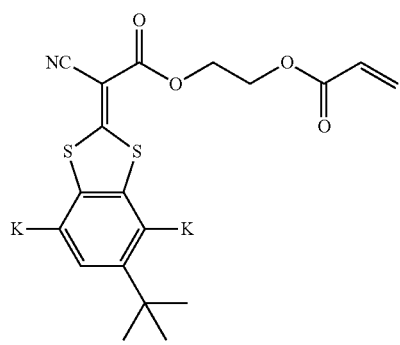
(16)
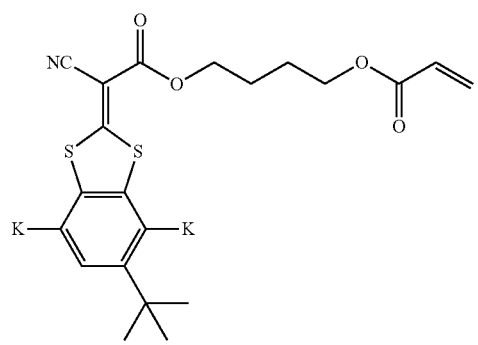
(17)
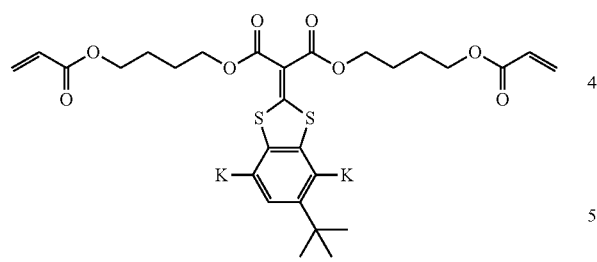
-continued
(18)
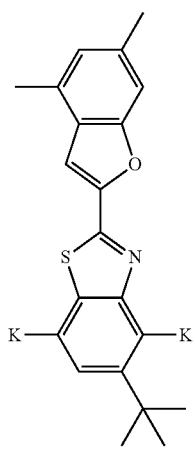
(19)
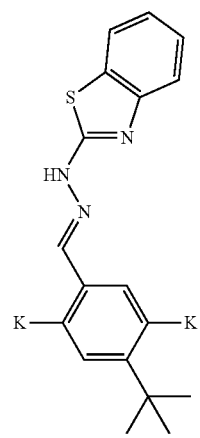
(1-10)
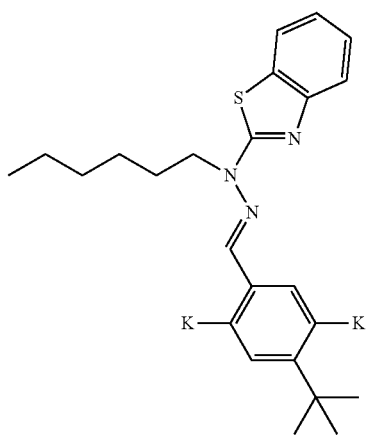
TABLE 1
| K (Side chain structure) |
| --- |
1-1
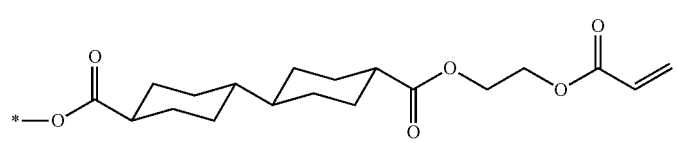 [SMILES: *OC(=O)C1CCC(C2CCC(C(=O)OCCOC(=O)C=C)CC2)CC1]

TABLE 1-continued
| K (Side chain structure) |
1-2 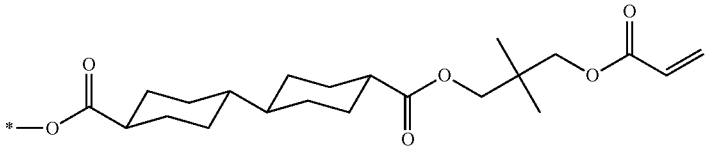 [SMILES: *OC(=O)C1CCC(C2CCC(C(=O)OCC(C)(C)COC(=O)C=C)CC2)CC1]
1-3 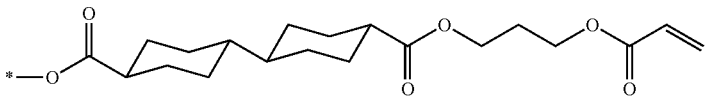 [SMILES: *OC(=O)C1CCC(C2CCC(C(=O)OCCCOC(=O)C=C)CC2)CC1]
1-4 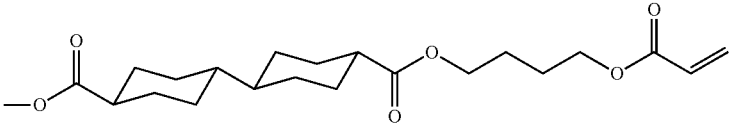
1-5 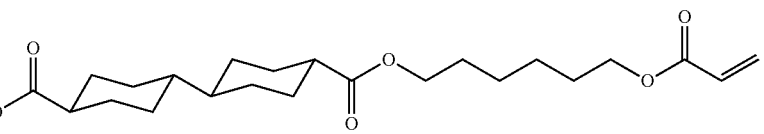
1-6 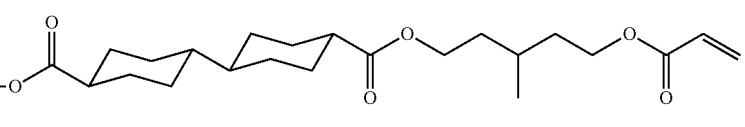
1-7 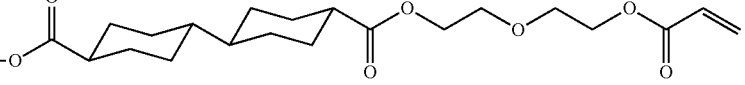
1-8 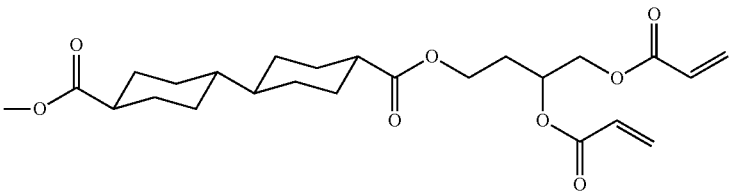
1-9 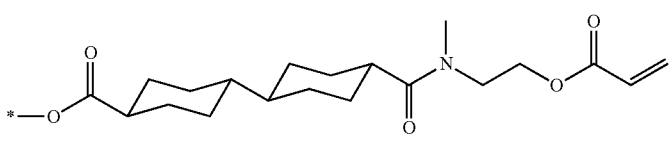 [SMILES: *OC(=O)C1CCC(C2CCC(C(=O)N(C)CCOC(=O)C=C)CC2)CC1]
1-10 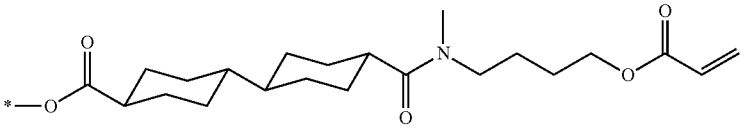 [SMILES: *OC(=O)C1CCC(C2CCC(C(=O)N(C)CCCCOC(=O)C=C)CC2)CC1]
1-11 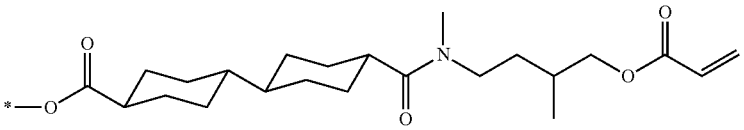 [SMILES: *OC(=O)C1CCC(C2CCC(C(=O)N(C)CCC(C)COC(=O)C=C)CC2)CC1]
1-12 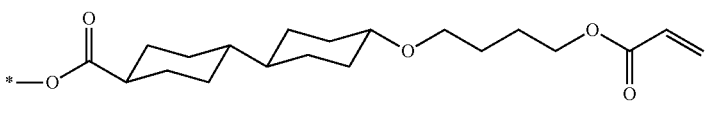 [SMILES: *OC(=O)C1CCC(C2CCC(OCCCCOC(=O)C=C)CC2)CC1]

TABLE 1-continued
| | K (Side chain structure) |
|---|---|
| 1-13 | 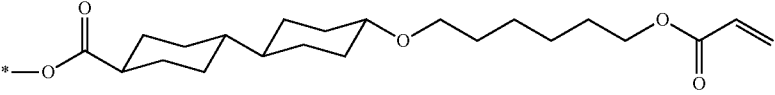 [SMILES: *OC(=O)C1CCC(C2CCC(OCCCCCCOC(=O)C=C)CC2)CC1] |
| 1-14 | 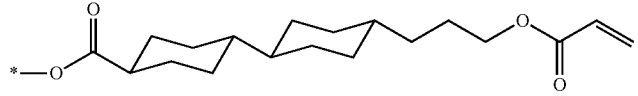 [SMILES: *OC(=O)C1CCC(C2CCC(CCCOC(=O)C=C)CC2)CC1] |
TABLE 2
| | K (Side chain structure) |
|---|---|
| 2-1 | 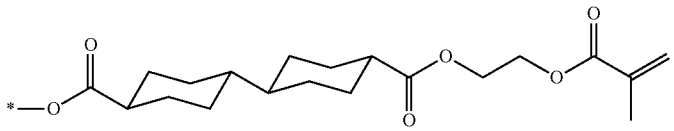 [SMILES: *OC(=O)C1CCC(C2CCC(C(=O)OCCOC(=O)C(=C)C)CC2)CC1] |
| 2-2 | 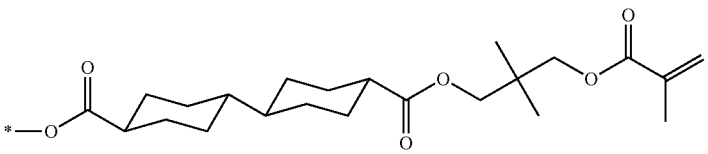 [SMILES: *OC(=O)C1CCC(C2CCC(C(=O)OCC(C)(C)COC(=O)C(=C)C)CC2)CC1] |
| 2-3 | 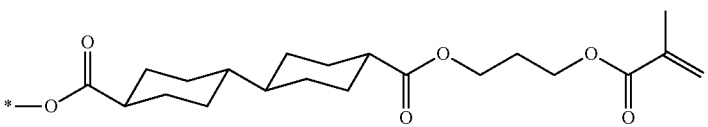 [SMILES: *OC(=O)C1CCC(C2CCC(C(=O)OCCCOC(=O)C(=C)C)CC2)CC1] |
| 2-4 | 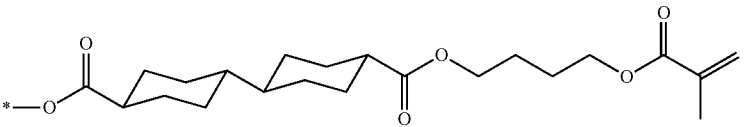 [SMILES: *OC(=O)C1CCC(C2CCC(C(=O)OCCCCOC(=O)C(=C)C)CC2)CC1] |
| 2-5 | 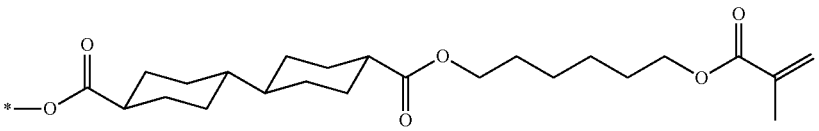 [SMILES: *OC(=O)C1CCC(C2CCC(C(=O)OCCCCCCOC(=O)C(=C)C)CC2)CC1] |
| 2-6 | 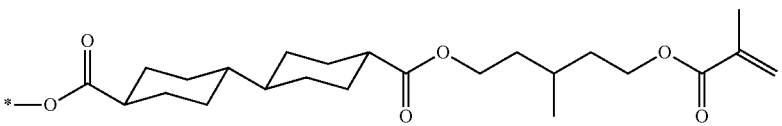 [SMILES: *OC(=O)C1CCC(C2CCC(C(=O)OCCC(C)CCOC(=O)C(=C)C)CC2)CC1] |
| 2-7 | 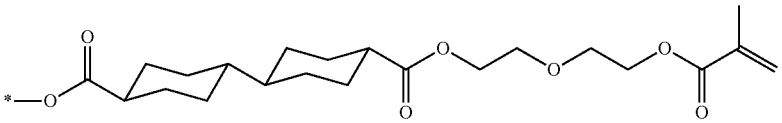 [SMILES: *OC(=O)C1CCC(C2CCC(C(=O)OCCOCCOC(=O)C(=C)C)CC2)CC1] |

TABLE 2-continued

K (Side chain structure)

2-8

2-9

2-10

2-11

2-12

2-13

2-14

[Polymerizable Liquid Crystal Compound (2)]

The polymerizable liquid crystal compound (2) contained in the polymerizable liquid crystal composition of the embodiment of the present invention is a polymerizable liquid crystal compound represented by Formula (2).

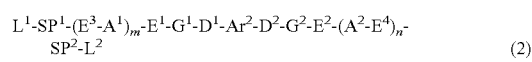

In Formula (2), $D^1$, $D^2$, $E^1$, $E^2$, $E^3$, $E^4$, $G^1$, $G^2$, $A^1$, $A^2$, $SP^1$, $SP^2$, $L^1$, $L^2$, m, and n are the same as described in Formula (1).

On the other hand, in Formula (2), $Ar^2$ represents any aromatic ring selected from the group consisting of groups represented by Formulae (Ar-1) to (Ar-6).

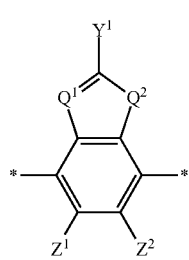

(Ar-1)

-continued

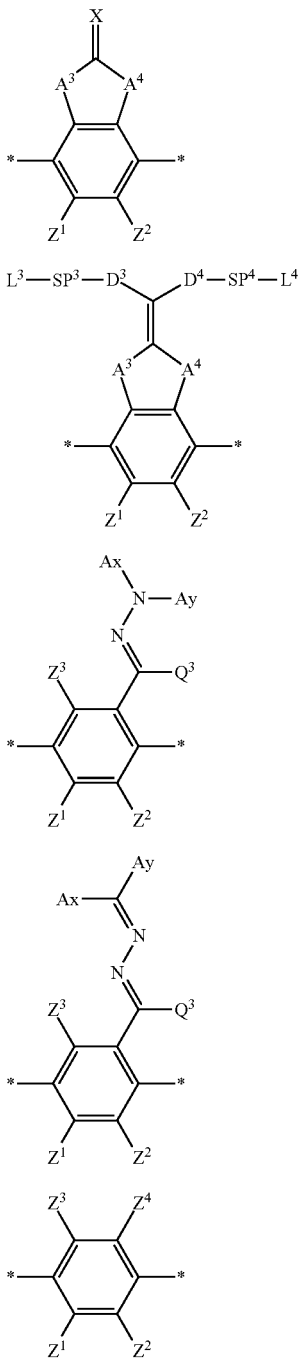

(Ar-2)

(Ar-3)

(Ar-4)

(Ar-5)

(Ar-6)

Formulae (Ar-1) to (Ar-5) of Formulae (Ar-1) to (Ar-6) are each the same as those described as $Ar^1$ in Formula (1).

Furthermore, in Formula (Ar-5), $Z^1$, $Z^2$, and $Z^3$ are each the same as $Z^1$, $Z^2$, and $Z^3$ in Formulae (Ar-1) to (Ar-5).

It should be noted that in the present invention, $Z^1$, $Z^2$, $Z^3$, and $Z^4$ in $Ar^2$ in Formula (2) each represent a group having a van der Waals volume of less than $0.3 \times 10^2$ Å$^3$. Incidentally, in the present invention, a group having a van der Waals volume of less than $0.3 \times 10^2$ Å$^3$ also includes a hydrogen atom as described above.

Examples of the substituent having a van der Waals volume of less than $0.3 \times 10^2$ Å$^3$ include a hydrogen atom ($0.06 \times 10^2$ Å$^3$), —CH$_3$ ($0.25 \times 10^2$ Å$^3$), —CHO ($0.27 \times 10^2$ Å$^3$), and —CN ($0.27 \times 10^2$ Å$^3$), —OCH$_3$ ($0.30 \times 10^2$ Å$^3$), and —COOH ($0.33 \times 10^2$ Å$^3$). Incidentally, the numerical values in parentheses are the values of van der Waals volumes.

Suitable examples of such a polymerizable liquid crystal compound (2) include compounds represented by Formulae (2-1) to (2-4), and specifically, the compounds which have side chain structures shown in Tables 1 and 2 below as K (side chain structure) in Formulae (2-1) to (2-4).

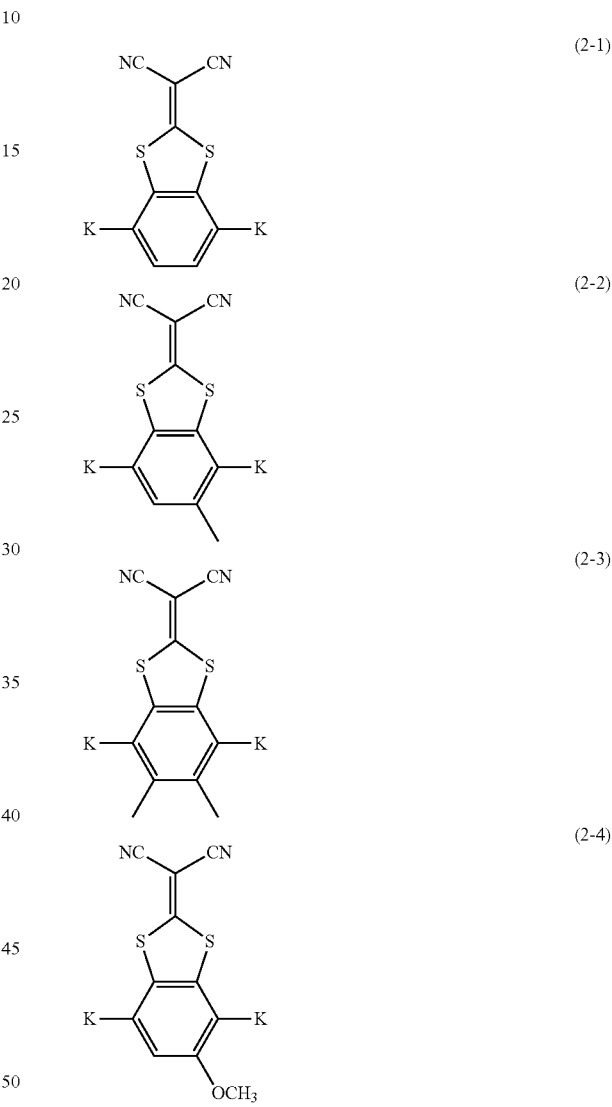

In the present invention, the content of the polymerizable liquid crystal compound (2) is preferably 30 to 300 parts by mass, more preferably 50 to 150 parts by mass, and still more preferably 70 to 120 parts by mass, with respect to 100 parts by mass of the above-mentioned polymerizable liquid crystal compound (1).

In the present invention, for the polymerizable liquid crystal compound (1) and the polymerizable liquid crystal compound (2), it is preferable that $Ar^1$ in Formula (1) and $Ar^2$ in Formula (2) both represent a group represented by Formula (Ar-1) or (Ar-2) from the viewpoint of expanding the control range of the wavelength dispersion characteristics.

Furthermore, in the present invention, for the polymerizable liquid crystal compound (1) and the polymerizliquid crystal compound (2), it is preferable that the total number of rings represented by G¹, G², A¹, and A² in Formula (1) is the same as the total number of rings represented by G¹, G², A¹, and A² in Formula (2) for a reason that the degree of alignment of an optically anisotropic film thus formed can be easily adjusted to 0.4 or more.

In the present invention, for a reason that the moisture-heat resistance of the optically anisotropic film is improved, the I/O value of the liquid crystal compound included in the polymerizable liquid crystal composition of the embodiment of the present invention is preferably 0.51 or less, and more preferably 0.43 to 0.50 as a weighted average value. Incidentally, the liquid crystal compound for which the I/O value is determined is not limited to the polymerizable liquid crystal compounds represented by Formulae (1) and (2), and is any of the liquid crystal compounds included in the polymerizable liquid crystal composition of the embodiment of the present invention.

Here, the "I/O value" is used as one unit for predicting various physicochemical properties of an organic compound. The magnitude of organicity is obtained by comparison of the number of carbon atoms and the magnitude of inorganicity is obtained by comparison of the boiling points of the same number of hydrocarbons as the number of carbon atoms. For example, the organicity value of one (—CH₂—) (actually C) is determined as 20 and the inorganicity value is determined as 100 from an influence of a hydroxyl group (—OH) on the boiling point. Based on the inorganicity value of (—OH) of 100, values of other substituents (inorganic groups) are obtained, which is shown as an "inorganic group table". According to the inorganic group table, the ratio I/O of inorganicity (I) value and organicity (O) value obtained for each molecule is defined as "I/O value". It is shown that the larger the I/O value, the higher the hydrophilicity thereof, and the smaller the I/O value, the stronger the hydrophobicity.

In the present invention, the "I/O value" is a value of "inorganicity (I)/organicity (O)" obtained by a method described in "YOSHIO KOUDA et al., "New edition: Organic Conceptual Diagram Foundation and Application", November 2008, SANKYO PUBLISHING".

[Polyfunctional Polymerizable Monomer]

For a reason that the optically anisotropic film is firmly aggregated and the moisture-heat resistance is further improved, it is preferable that the polymerizable liquid crystal composition of the embodiment of the present invention does not correspond to any of Formulae (1) and (2), and contains a polymerizable compound (polyfunctional polymerizable monomer) having two or more polymerizable groups.

The polyfunctional polymerizable monomer is preferably a polyfunctional radically polymerizable monomer. Specific examples of the polyfunctional radically polymerizable monomer include the polymerizable monomers described in paragraphs [0018] to [0020] of JP2002-296423A.

In addition, in a case where a polyfunctional polymerizable monomer is contained, a content thereof is preferably 1% to 50% by mass, and more preferably 2% to 30% by mass, with respect to a total mass of the liquid crystal compound.

[Polymerization Initiator]

The polymerizable liquid crystal composition of the embodiment of the present invention preferably contains a polymerization initiator.

The polymerization initiator to be used is preferably a photopolymerization initiator capable of initiating a polymerization reaction upon irradiation with ultraviolet rays.

Examples of the photopolymerization initiator include α-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

In the present invention, for a reason that the moisture-heat resistance is further improved, the polymerization initiator is preferably an oxime-type polymerization initiator, and specifically, more preferably a polymerization initiator represented by Formula (I),

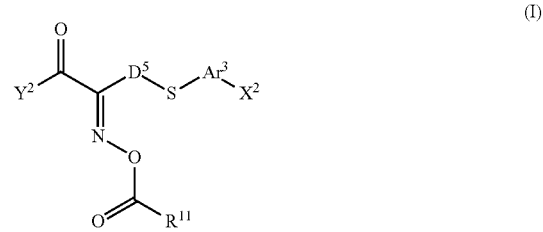

In Formula (I), X² represents a hydrogen atom or a halogen atom.

Furthermore, in Formula (I), Ar³ represents a divalent aromatic group and D⁵ represents a divalent organic group having 1 to 12 carbon atoms.

In addition, in Formula (I), R¹¹ represents an alkyl group having 1 to 12 carbon atoms and Y² represents a monovalent organic group.

In Formula (I), examples of the halogen atom represented by X² include a fluorine atom, a chlorine atom, a bromine atom, and an iodine atom, and among these, the chlorine atom is preferable.

Furthermore, in Formula (I), examples of the divalent aromatic group represented by Ar³ include divalent groups having an aromatic hydrocarbon ring such as a benzene ring, a naphthalene ring, an anthracene ring, and a phenanthroline ring; and divalent groups having an aromatic heterocyclic ring such as a furan ring, a pyrrole ring, a thiophene ring, a pyridine ring, a thiazole ring, and a benzothiazole ring.

Incidentally, in Formula (I), examples of the divalent organic group having 1 to 12 carbon atoms represented by D⁵ include a linear or branched alkylene group having 1 to 12 carbon atoms, and specific suitable examples thereof include a methylene group, an ethylene group, and a propylene group.

Moreover, in Formula (I), specific suitable examples of the alkyl group having 1 to 12 carbon atoms represented by R¹¹ include a methyl group, an ethyl group, and a propyl group.

In addition, in Formula (I), examples of the monovalent organic group represented by Y² include a functional group including a benzophenone skeleton ((C₆H₅)₂CO). Specifically, in a similar manner to the groups represented by Formula (Ia) and Formula (Ib), a functional group including a benzophenone skeleton in which a benzene ring at a terminal is unsubstituted or mono-substituted is preferable. Further, in Formula (Ia) and Formula (Ib), * represents a bonding position, and that is, a bonding position to the carbon atom of the carbonyl group in Formula (I).

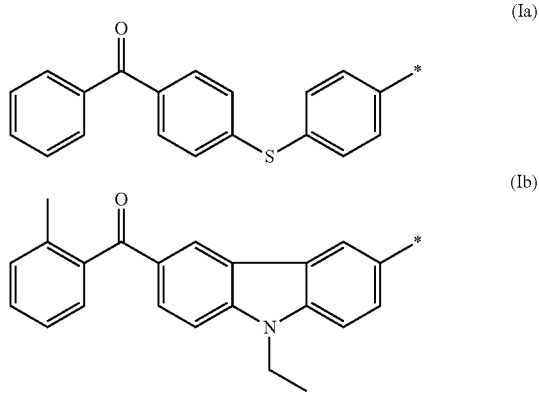

Examples of the oxime-type polymerization initiator represented by Formula (I) include a compound represented by Formula (S-1) and a compound represented by Formula (S-2),

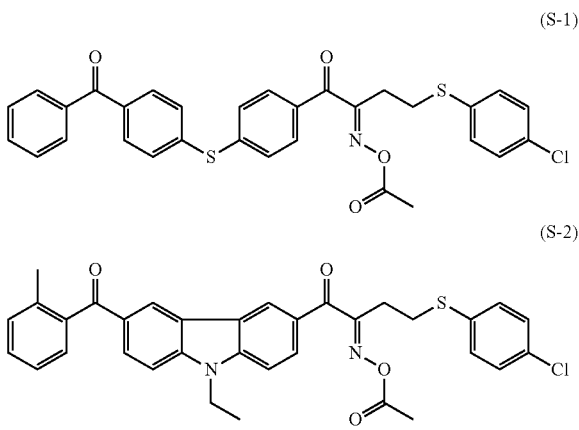

In the present invention, the content of the polymerization initiator is not particularly limited, but is preferably 0.01% to 20% by mass, and more preferably 0.5% to 5% by mass of the solid content of the polymerizable liquid crystal composition.

[Solvent]

It is preferable that the polymerizable liquid crystal composition of the embodiment of the present invention contains a solvent from the viewpoint of workability for forming an optically anisotropic film, and the like.

Specific examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these may be used singly or in combination of two or more kinds thereof.

[Leveling Agent]

It is preferable that the polymerizable liquid crystal composition of the embodiment of the present invention contains a leveling agent from the viewpoint that the surface of an optically anisotropic film is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Specific example of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). In addition, the leveling agent may also function as an alignment control agent which will be described later.

[Alignment Control Agent]

The polymerizable liquid crystal composition of the embodiment of the present invention can contain an alignment control agent, as desired.

With the alignment control agent, various alignment states such as homeotropic alignment (vertical alignment), tilt alignment, hybrid alignment, and cholesteric alignment can be formed, in addition to the homogeneous alignment, and specific alignment states can be controlled and achieved more uniformly and more accurately.

As an alignment control agent which accelerates the homogeneous alignment, for example, a low-molecular-weight alignment control agent or a high-molecular-weight alignment control agent can be used.

With regard to the low-molecular-weight alignment control agent, reference can be made to the description in, for example, paragraphs [0009] to [0083] of JP2002-020363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Furthermore, examples of the alignment control agent that forms or accelerates the homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are hereby incorporated by reference.

On the other hand, the cholesteric alignment can be achieved by adding a chiral agent to the polymerizable liquid crystal composition of the embodiment of the present invention, and it is possible to control the direction of revolution of the cholesteric alignment by its chiral direction. Incidentally, it is possible to control the pitch of the cholesteric alignment in accordance with the alignment regulating force of the chiral agent.

In a case where an alignment control agent is contained, a content thereof is preferably 0.01% to 10% by mass, and more preferably 0.05% to 5% by mass, with respect to the mass of the total solid content of the polymerizable liquid crystal composition. In a case where the content is within the range, it is possible to obtain an optically anisotropic film which has no precipitation or phase separation, alignment defects, or the like, and is homogeneous and highly transparent while achieving a desired alignment state.

These alignment control agents can further impart a polymerizable functional group, in particular, a polymerizable functional group which is polymerizable with a polymerizable liquid crystal compound constituting the polymerizable liquid crystal composition of the embodiment of the present invention.

[Other Components]

The polymerizable liquid crystal composition of the embodiment of the present invention may contain components other than the above-mentioned components, and examples of such other components include a liquid crystal compound other than the above-mentioned polymerizable liquid crystal compound, a surfactant, a tilt angle control agent, an alignment aid, a plasticizer, and a crosslinking agent.

[Formation Method]

Examples of a method for forming the optically anisotropic film include a method in which the above-mentioned polymerizable liquid crystal composition of the embodiment of the present invention is used to cause a desired alignment state, which is then fixed by polymerization.

Here, the polymerization conditions are not particularly limited, but in the polymerization by irradiation with light, ultraviolet rays are preferably used. The irradiation dose is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 mJ/cm$^2$ to 1,000 mJ/cm$^2$. In addition, the polymerization may be carried out under a heating condition in order to accelerate the polymerization reaction.

In addition, in the present invention, the optically anisotropic film can be formed on any of supports in the optical film of the embodiment of the present invention which will be described later or a polarizer in the polarizing plate of an embodiment of the present invention which will be described later.

The thickness of the optically anisotropic film of the embodiment of the present invention is preferably 0.1 to 10 µm, more preferably 0.1 to 5 µm, and still more preferably 0.1 µm or more and less than 3 µm, from the viewpoint of reducing the thickness.

As described above, the optically anisotropic film of the embodiment of the present invention satisfies Formula (3) or (4), and preferably satisfies Formula (5) in a case where it satisfies Formula (3).

$$Re(450)/Re(550)<1 \quad (3)$$

$$Rth(450)/Rth(550)<1 \quad (4)$$

$$0.50<Re(450)/Re(550)<1.00 \quad (5)$$

In Formulae (3) and (5), Re(450) represents an in-plane retardation of the optically anisotropic film at a wavelength of 450 nm, and Re(550) represents an in-plane retardation of the optically anisotropic film at a wavelength of 550 nm. Incidentally, in the present specification, in a case where the measurement wavelength of the retardation is not specified, the measurement wavelength is 550 nm.

In addition, in Formula (4), Rth(450) represents a thickness-direction retardation of the optically anisotropic film at a wavelength of 450 nm, and Rth(550) represents a thickness-direction retardation of the optically anisotropic film at a wavelength of 550 nm.

In the present invention, the values of the in-plane retardation and the thickness-direction retardation refer to values measured with light at the measurement wavelength using AxoScan OPMF-1 (manufactured by Opto Science, Inc.).

Specifically, by inputting the average refractive index ((Nx+Ny+Nz)/3) and the film thickness (d (µm)) to AxoScan OPMF-1, it is possible to calculate:

Slow axis direction (°)

$Re(\lambda)=R0(\lambda)$ $Rth(\lambda)=((nx+ny)/2-nz)\times d$.

In addition, R0(λ) is expressed in a numerical value calculated with AxoScan OPMF-1, but means Re(λ).

As described above, the optically anisotropic film of the embodiment of the present invention has a degree of alignment of 0.4 or more, as measured by Raman spectroscopy, and the degree of alignment is preferably 0.4 or more and less than 0.6 from the viewpoint of suppressing an increase in the viscosity due to a high degree of alignment and alignment defects.

Here, the degree of alignment as measured by Raman spectroscopy is defined as a second degree of alignment order <P2>, and can be obtained by a polarized Raman measurement method. As a polarization Raman spectrometer, NanoFinder 30 manufactured by Tokyo Instruments, Inc. can be used.

Specifically, an angle q between the azimuth of the plane of the optically anisotropic film on which laser polarized light is incident and the electric field direction of the incident laser polarized light is changed from 0 degree to 180 degrees; the polarization components (I∥(q)) parallel to the electric field of the incident laser polarized light and the polarization components (I⊥(q)) vertical to the electric field of the incident laser polarized light among the measured scattered light components are each spectrally detected using an analyzer; and further, for a band having a peak derived from the molecular skeleton, fitting analysis based on the least squares method using Theoretical Formula (A) is performed, whereby a degree of alignment order can be obtained.

$I\|(q)=C1(q)+C2(q)<P2>+C3(q)<P4>+C4(q)R$ $I\bot(q)=C5(q)+C6(q)<P2>+C7(q)<P4>-C4(q)R$ $C1(q)=a2+4/45b2-2(a2+b2)\cos 2q+2(a2+1/45b2)\cos 4q$ $C2(q)=-2/3ab-4/63b2+(4/3ab+2/9b2)\cos 2q+(-2/63a2+2/3ab)\cos 4q$ $C3(q)=b2(3/35+2/7 \cos 2q+19/35 \cos 4q)$ $C4(q)=\cos 2q-\cos 4q$ $C5(q)=1/15b2+(2a2+2/45b2)\cos 2q-(2a2+2/45b2)\cos 4q$ $C6(q)=1/21b2+(2/3ab-2/63b2)\cos 2q+(2/63a2-2/3ab)\cos 4q$ $C7(q)=b2(-4/35+19/35 \cos 2q-19/35 \cos 4q)$ $R=r1[2a2-4/45b2+(2/3ab-8/63b2)<P2>-8/35b2<P4>]+r2b2[2/15\pm2/21<P2>-8/35<P4>]$ $r1=\sin(K1d)/K1d, r2=\sin(K2d)/K2d, K1=2\pi\Delta n(L+L')/LL', K2=2\pi\Delta n(L-L')/LL'$ <Theoretical Formula (A)>

Here, d is the thickness of a sample, Δn is the birefringence of the sample, and L and L' are wavelengths of incidence rays and scattered light, respectively.

Furthermore, <P2> is a second degree of alignment order, and <P4> is a fourth degree of alignment order.

Moreover, a and b are isotropic and anisotropic values of a Raman tensor α=diag (a⊥, a⊥, a∥) of a band having a peak derived from the molecular skeleton, respectively, and a=(2a⊥+a∥)/3, b=a∥−a⊥ is satisfied.

In addition, a/b can be determined by a relational formula of Riso=3b2/(45a2+4b2) from the measured value of a depolarization degree Riso in a case where the molecules are isotropically distributed.

The degree of alignment of the optically anisotropic film can be controlled by a combination of the above-mentioned polymerizable liquid crystal compound (1) and polymerizable liquid crystal compound (2) and a blending ratio thereof, and can also be controlled by the other components included in the polymerizable liquid crystal composition.

Furthermore, the degree of alignment can also be controlled by adjusting the surface condition of a base material or an alignment film, and fixing conditions in an alignment state by coating, drying, alignment and aging, or exposure.

The optically anisotropic film of the embodiment of the present invention is preferably a positive A-plate or a positive C-plate, and more preferably the positive A-plate.

Incidentally, in a case where the optically anisotropic film is the positive A-plate, it satisfies Formula (3), and in a case where the optically anisotropic film is the positive C-plate, it satisfies Formula (4).

Here, the positive A-plate (A-plate which is positive) and the positive C-plate (C-plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A-plate satisfies the relationship of Formula (A1) and the positive C-plate satisfies the relationship of Formula (C1). In addition, the positive A-plate has an Rth showing a positive value and the positive C-plate has an Rth showing a negative value.

$nx>ny\approx nz$   Formula (A1)

$nz>nx\approx ny$   Formula (C1)

Furthermore, the symbol, "≈", encompasses not only a case where the both are completely the same as each other but also a case where the both are substantially the same as each other.

The expression, "substantially the same", means that with regard to the positive A-plate, for example, a case where (ny−nz)×d (in which d is the thickness of a film) is −10 to 10 nm, and preferably −5 to 5 nm is also included in "ny≈nz", and a case where (nx−nz)×d is −10 to 10 nm, and preferably −5 to 5 nm is also included in "nx≈nz". In addition, with regard to the positive C-plate, for example, a case where (nx−ny)×d (in which d is the thickness of a film) is 0 to 10 nm, and preferably 0 to 5 nm is also included in "nx≈ny".

In a case where the optically anisotropic film of the embodiment of the present invention is a positive A-plate, the Re(550) is preferably 100 to 180 nm, more preferably 120 to 160 nm, still more preferably 130 to 150 nm, and particularly preferably 130 to 140 nm, from the viewpoint that the optically anisotropic film functions as a λ/4 plate.

Here, the "λ/4 plate" is a plate having a λ/4 function, specifically, a plate having a function of converting a linearly polarized light at a certain specific wavelength into a circularly polarized light (or converting a circularly polarized light to a linearly polarized light).

[Optical Film]

The optical film of the embodiment of the present invention is an optical film having the optically anisotropic film of the embodiment of the present invention.

Hereinafter, various members used for the optical film of the embodiment of the present invention will be described in detail.

[Optically Anisotropic Film]

The optically anisotropic film which the optical film of the embodiment of the present invention has is the above-mentioned optically anisotropic film of the embodiment of the present invention.

[Support]

The optical film of the embodiment of the present invention may have a support as a base material for forming an optically anisotropic film as described above.

Such a support is preferably transparent, and specifically, it preferably has a light transmittance of 80% or more.

Examples of such a support include a glass substrate and a polymer film, and examples of the material for the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; arid polymers obtained by mixing these polymers.

In addition, an aspect in which a polarizer which will be described later may also function as such a support is also available.

In the present invention, the thickness of the support is not particularly limited, but is preferably 5 to 60 μm, and more preferably 5 to 30 μm.

[Alignment Film]

In a case where the optical film of the embodiment of the present invention has any of the above-mentioned supports, it is preferable that the optical film has an alignment film between the support and the optically anisotropic film. Further, an aspect in which the above-mentioned support may also function as an alignment film is also available.

The alignment film generally has a polymer as a main component. The materials for the polymer material for an alignment film are described in many documents, and many commercially available products can be used.

The polymer material used in the present invention is preferably a polyvinyl alcohol or a polyimide, or a derivative thereof. Particularly, a modified or non-modified polyvinyl alcohol is preferable.

Examples of the alignment film that can be used in the present invention include the alignment films described for Line 24 on Page 43 to Line 8 on Page 49 of WO01/088574A; the modified polyvinyl alcohols described in paragraphs [0071] to [0095] of JP3907735B; and the liquid crystal alignment film formed by a liquid crystal aligning agent described in JP2012-155308A.

In the present invention, for a reason that it is possible to prevent deterioration in the surface condition by avoiding a contact with the surface of an alignment film upon formation of the alignment film, a photo-alignment film is also preferably used as the alignment film.

The photo-alignment film is not particularly limited, but the polymer materials such as a polyamide compound and a polyimide compound, described in paragraphs [0024] to [0043] of WO2005/096041A; the liquid crystal alignment film formed by a liquid crystal aligning agent having a photo-alignment group, described in JP2012-155308A; LPP-JP265CP, trade name, manufactured by Rolie Technologies Ltd.; or the like can be used.

In addition, in the present invention, the thickness of the alignment film is not particularly limited, but from the viewpoint of forming an optically anisotropic film having a homogeneous film thickness by alleviating the surface roughness that can be present on the support, the thickness is preferably 0.01 to 10 μm, more preferably 0.01 to 1 μm, and still more preferably 0.01 to 0.5 μm.

[Hard Coat Layer]

It is preferable that the optical film of the embodiment of the present invention has a hard coat layer in order to impart physical strength to the film. Specifically, the optical film may have the hard coat layer on the side of the support opposite to the side on which the alignment film is provided or the optical film may have the hard coat layer on the side of the optically anisotropic film opposite to the side on which the alignment film is provided.

As the hard coat layer, those described in paragraphs [0190] to [0196] of JP2009-098658A can be used.

[Other Optically Anisotropic Films]

The optical film of the embodiment of the present invention may have other optically anisotropic films, in addition to the optically anisotropic film of the embodiment of the present invention.

That is, the optical film of the embodiment of the present invention may have a laminated structure having the optically anisotropic film of the embodiment of the present invention and other optically anisotropic films.

Such other optically anisotropic films are not particularly limited as long as the optically anisotropic films are obtained by not blending either or both of the polymerizable liquid crystal compound (1) or the polymerizable liquid crystal compound (2), but using other polymerizable compounds (in particular, liquid crystal compounds).

Here, the liquid crystal compounds can be generally classified into a rod-shaped type and a disk-shaped type according to the shape thereof. Each of the types can further be classified into a low-molecular-weight type and a high-molecular-weight type. The term, high-molecular-weight, generally refers to having a degree of polymerization of 100 or more (Polymer Physics-Phase Transition Dynamics, by Masao Doi, page 2, published by Iwanami Shoten, Publishers, 1992). In the present invention, any of the liquid crystal compounds can be used, but the rod-shaped liquid crystal compound or the discotic liquid crystal compound. (disk-shaped liquid crystal compound) is preferably used. Two or more kinds of the rod-shaped liquid crystal compounds, two or more kinds of the disk-shaped liquid crystal compounds, or a mixture of the rod-shaped liquid crystal compound and the disk-shaped liquid crystal compound may be used. In order to fix the above-mentioned liquid crystal compound, it is more preferable that the liquid crystal compound is formed of a rod-shaped liquid crystal compound or disk-shaped liquid crystal compound having a polymerizable group, and it is still more preferable that the liquid crystal compound has two or more polymerizable groups in one molecule. In the case of a mixture of two or more kinds of the liquid crystal compounds, at least one kind of the liquid crystal compound preferably has two or more polymerizable groups in one molecule.

As the rod-shaped liquid crystal compound, for example, the rod-shaped liquid crystal compounds described in claim 1 of JP1999-513019A (JP-H11-513019A) or paragraphs [0026] to [0098] of JP2005-289980A can be preferably used, and as the discotic liquid crystal compound, for example, the discotic liquid crystal compounds described in paragraphs [0020] to [0067] of JP2007-108732A and paragraphs [0013] to [0108] of JP2010-244038A can be preferably used, but the liquid crystal compounds are not limited thereto.

[Ultraviolet Absorber]

The optical film of the embodiment of the present invention preferably includes an ultraviolet (UV) absorber, taking an effect of external light (particularly ultraviolet rays) into consideration.

The ultraviolet absorber may be contained in the optically anisotropic film of the embodiment of the present invention or may also be contained in a member other than an optically anisotropic film constituting the optical film of the embodiment of the present invention. Suitable examples of the member other than the optically anisotropic film include a support.

As the ultraviolet absorber, any one of ultraviolet absorbers known in the related art, which can express ultraviolet absorptivity, can be used. Among such the ultraviolet absorbers, a benzotriazole-based or hydroxyphenyltriazine-based ultraviolet absorber is preferably used from the viewpoint that it has high ultraviolet absorptivity and ultraviolet absorbing ability (ultraviolet-shielding ability) used for an image display device is obtained.

In addition, in order to broaden ultraviolet absorbing ranges, two or more of ultraviolet absorbers having different maximum absorption wavelengths can be used in combination.

Specific examples of the ultraviolet absorber include the compounds described in paragraphs [0258] and [0259] of JP2012-018395A and the compounds described in paragraphs [0055] to [0105] of JP2007-072163A.

In addition, as a commercially available product thereof, for example, Tinuvin 400, Tinuvin 405, Tinuvin 460, Tinuvin 477, Tinuvin 479, and Tinuvin 1577 (all manufactured by BASF) can be used.

[Polarizing Plate]

A polarizing plate of an embodiment of the present invention has the above-mentioned optical film of the embodiment of the present invention and a polarizer.

Furthermore, in a case where the above-mentioned optically anisotropic film of the embodiment of the present invention is a λ/4 plate (positive A-plate), the polarizing plate of the embodiment of the present invention can be used as a circularly polarizing plate In addition, in a case where the above-mentioned optically anisotropic film of the embodiment of the present invention is a λ/4 plate (positive A-plate), an angle between the slow axis of the λ/4 plate and the absorption axis of a polarizer which will be described later is preferably 30° to 60°, more preferably 40° to 50°, still more preferably 42° to 48°, and particularly preferably 45° in the polarizing plate of the embodiment of the present invention.

Here, the "slow axis" of the λ/4 plate means a direction in which the refractive index in the plane of the λ/4 plate becomes maximum, and the "absorption axis" of the polarizer means a direction in which the absorbance is highest.

Figure 2:
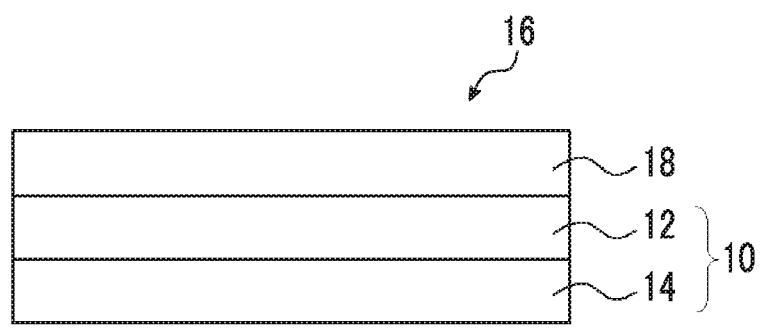
FIG. 2 is a schematic cross-sectional view showing an example of the polarizing plate of an embodiment of the present invention.

FIG. 2 is a schematic cross-sectional view showing an example (a circularly polarizing plate) of the polarizing plate of the embodiment of the present invention.

A circularly polarizing plate 16 shown in FIG. 2 includes a polarizer 18, a positive A-plate 12, and a positive C-plate 14 in this order. In FIG. 2, in the circularly polarizing plate 16, the polarizer 18, the positive A-plate 12, and the positive C-plate 14 are arranged in the order, but the circularly polarizing plate is not limited to this mode, and for example, the polarizer, the positive C-plate, and the positive A-plate may be arranged in this order.

Figure 3:
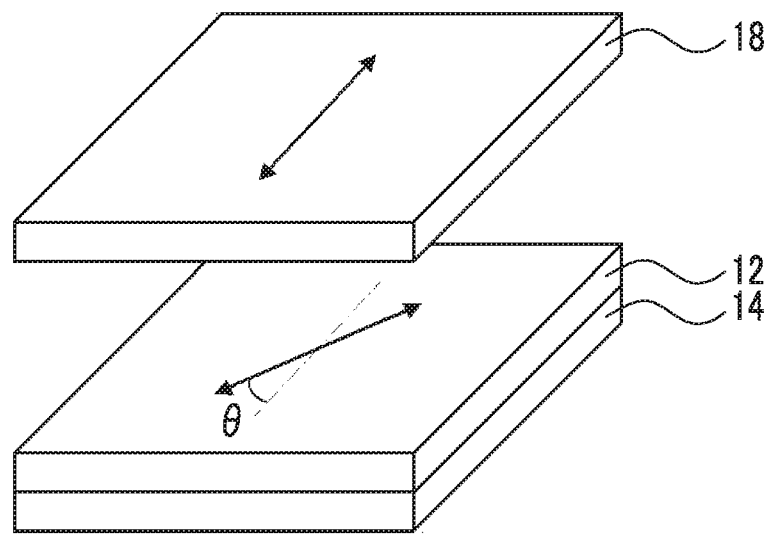
FIG. 3 is a view showing a relationship between the absorption axis of a polarizer and an in-plane slow axis of a positive A-plate in the polarizing plate of the embodiment of the present invention.

FIG. 3 is a view showing a relationship between the absorption axis of the polarizer and the in-plane slow axis of the positive A-plate in the polarizing plate of the embodiment of the present invention.

In FIG. 3, the arrow in the polarizer 18 indicates the direction of the absorption axis, and the arrow in the positive A-plate 12 indicates the direction of the in-plane slow axis in the layer.

[Polarizer]

A polarizer contained in a polarizing plate of an embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dyeing in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

A polarizer in which thin films having different birefringences are laminated, a wire grid-type polarizer, a polarizer having a combination of a cholesteric liquid crystal having a selective reflection range and a ¼ wavelength plate, or the like is used as the reflective type polarizer.

Among those, a polarizer including a polyvinyl alcohol-based resin (a polymer including —$CH_2$—CHOH— as a repeating unit, in particular, at least one selected from the group consisting of a polyvinyl alcohol and an ethylene-vinyl alcohol copolymer) is preferable from the viewpoint that it has more excellent adhesiveness.

In the present invention, the thickness of the polarizer is not particularly limited, but is preferably 3 μm to 60 μm, more preferably 5 μm to 30 μm, and still more preferably 5 μm to 15 μm.

[Pressure-Sensitive Adhesive Layer]

The polarizing plate of the embodiment of the present invention may have a pressure-sensitive adhesive layer arranged between the optically anisotropic film in the optical film of the embodiment of the present invention and the polarizer.

The pressure-sensitive adhesive layer used for lamination of the optically anisotropic film and the polarizer represents, for example, a substance in which a ratio (tan δ=G"/G') between a storage elastic modulus G' and a loss elastic modulus G", each measured with a dynamic viscoelastometer, is 0.001 to 1.5, and examples thereof include a so-called pressure-sensitive adhesive or a readily creepable substance. Examples of the pressure-sensitive adhesive that can be used in the present invention include a polyvinyl alcohol-based pressure-sensitive adhesive, but the pressure-sensitive adhesive is not limited thereto.

[Image Display Device]

An image display device of an embodiment of the present invention is an image display device having the optical film of the embodiment of the present invention or the polarizing plate of the embodiment of the present invention.

A display element used in the image display device of the embodiment of the present invention is not particularly limited, and examples thereof include a liquid crystal cell, an organic electroluminescent (hereinafter simply referred to as "EL") display panel, and a plasma display panel.

Among those, the liquid crystal cell and the organic EL display panel are preferable, and the liquid crystal cell is more preferable. That is, as the image display device of the embodiment of the present invention, a liquid crystal display device using a liquid crystal cell as a display element or an organic EL display device using an organic EL display panel as a display element is preferable, and the liquid crystal display device is more preferable.

[Liquid Crystal Display Device]

A liquid crystal display device which is an example of the image display device of the embodiment of the present invention is a liquid crystal display device having the above-mentioned polarizing plate of the embodiment of the present invention and a liquid crystal cell.

In addition, in the present invention, it is preferable that the polarizing plate of the embodiment of the present invention is used as the polarizing plate of the front side, and it is more preferable that the polarizing plate of the embodiment of the present invention is used as the polarizing plates on the front and rear sides, among the polarizing plates provided on the both sides of the liquid crystal cell.

Hereinafter, the liquid crystal cell constituting the liquid crystal display device will be described in detail.

<Liquid Crystal Cell>

A liquid crystal cell for use in the liquid crystal display device is preferably in a vertical alignment (VA) mode, an optically compensated bend (OCB) mode, an in-plane-switching (IPS) mode, or a twisted nematic (TN) mode, but the liquid crystal cell is not limited thereto.

In a TN-mode liquid crystal cell, rod-shaped liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-shaped liquid crystal molecules are substantially vertically aligned during no voltage application thereto. Examples of the VA-mode liquid crystal cell include (1) a VA-mode liquid crystal cell in the narrow sense of the word, in which rod-shaped liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA mode is multi-domained for viewing angle enlargement (described in SID97, Digest of Tech. Papers (preprint), 28 (1997) 845), (3) a liquid crystal cell in a mode (n-ASM mode) in which rod-shaped liquid crystal molecules are substantially vertically aligned during no voltage application thereto and are multidomain-aligned during voltage application thereto (described in Seminar of Liquid Crystals of Japan, Papers (preprint), 58-59 (1998)), and (4) a survival-mode liquid crystal cell (announced in LCD International 98). In addition, the liquid crystal cell may be of any of a patterned vertical alignment (PVA) type, an optical alignment type, and a polymer-sustained alignment (PSA) type. Details of these modes are specifically described in JP2006-215326A and JP2008-538819A.

In an IPS-mode liquid crystal cell, rod-shaped liquid crystal molecules are aligned substantially parallel with respect to a substrate, and application of an electric field parallel to the substrate surface causes the liquid crystal molecules to respond planarly. The IPS mode displays black in a state where no electric field is applied and a pair of upper and lower polarizing plates have absorption axes which are orthogonal to each other. A method of improving the viewing angle by reducing light leakage during black display in an oblique direction using an optical compensation sheet is disclosed in JP 1998-054982A (JP-H10-054982A), JP1999-202323A (JP-H11-02323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

Suitable examples of the organic EL display device which is an example of the image display device of the embodiment of the present invention include an aspect which includes, from the visible side, a polarizer, a λ/4 plate (a positive A-plate) consisting of the optically anisotropic film of the embodiment of the present invention, and an organic EL display panel in this order.

Figure 4:
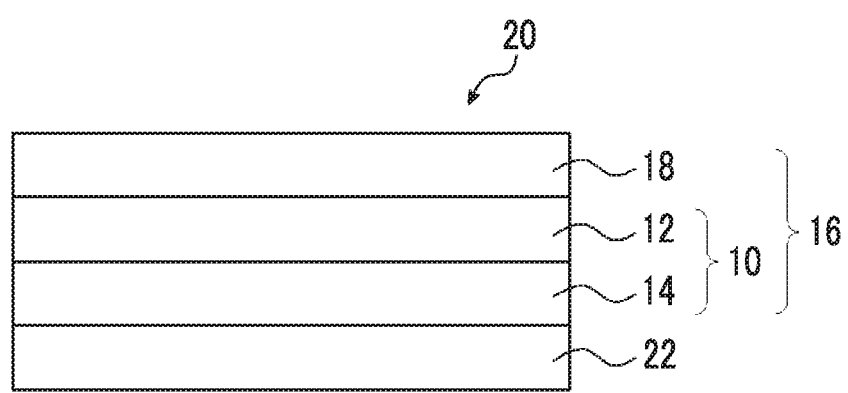
FIG. 4 is a schematic cross-sectional view showing an example of an organic electroluminescent display device which is one mode of an image display device of an embodiment of the present invention.

The organic EL display device will be described with reference to a drawing. FIG. 4 is a schematic cross-sectional view showing an example of an organic EL display device which is an embodiment of the image display device of the embodiment of the present invention.

The organic EL display device 20 shown in FIG. 4 has a linear polarizer 18, a positive A-plate 12, a positive C-plate 14, and an organic EL display panel 22 in this order. In addition, as shown in FIG. 4, the linear polarizer 18 in a circularly polarizing plate 16 is arranged on the visible side.

Furthermore, the organic EL display panel 22 is a display panel constituted with an organic EL element in which an organic light emitting layer (organic electroluminescent layer) is sandwiched between electrodes (between a cathode and an anode).

The configuration of the organic EL display panel 22 is not particularly limited but a known configuration is adopted.

EXAMPLES

Hereinafter, the features of the present invention will be described in more details with reference to Examples and Comparative Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to specific examples shown below.

Example 1

<Formation of Alignment Film P-1>

The following coating liquid for forming an alignment film P-1 was applied onto a glass substrate using a #18 bar coater, and the glass substrate was dried with hot air at 100° C. for 120 seconds and then subjected to a rubbing treatment to form an alignment film P-1.

(Coating Liquid for Forming Alignment Film P-1)

| | |
|---|---|
| Polyvinyl alcohol (PVA 203 manufactured by Kuraray C., Ltd.) | 2.0 parts by mass |
| Water | 98.0 parts by mass |

<Formation of Positive A-Plate A-1>

The following composition A-1 was applied onto the alignment film P-1 using a bar coater. The coating film formed on the alignment film P-1 was heated to 180° C. with hot air and then cooled to 120° C., and the coating film was irradiated with ultraviolet rays at 100 mJ/cm$^2$ at a wavelength of 365 nm in a nitrogen atmosphere using a high-pressure mercury lamp to fix the alignment of the liquid crystal compound, thereby manufacturing a glass plate A-1 including a positive A-plate A-1. The thickness of the positive A-plate A-1 is shown in Table 3 below. In addition, the weighted average value of I/O values of the liquid crystal compounds in the following composition A-1 is shown in Table 3 below.

(Composition A-1)

| | |
|---|---|
| The following polymerizable liquid crystal compound L-1 | 42.50 parts by mass |
| The following polymerizable liquid crystal compound L-2 | 42.50 parts by mass |
| The following polymerizable liquid crystal compound L-3 | 15.00 parts by mass |
| The following polymerization initiator PI-1 | 0.50 parts by mass |

| | |
|---|---|
| The following leveling agent T-1 | 0.20 parts by mass |
| Chloroform | 570.00 parts by mass |

Polymerizable liquid crystal compound L-1 (I/O value: 0.48, pKa value: 9.86)

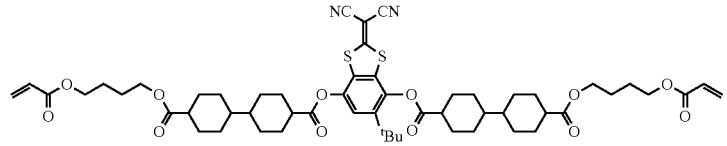

Polymerizable liquid crystal compound L-2 (I/O value: 0.52)

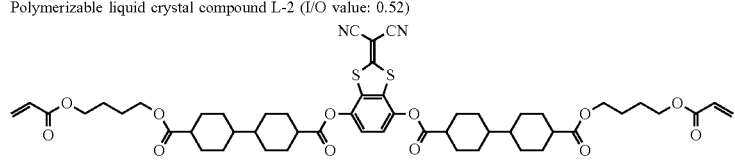

Polymerizable liquid crystal compound L-3 (I/O value: 0.50)

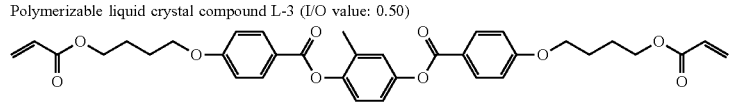

Polymerization initiator PI-1

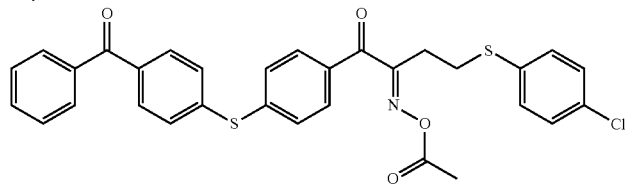

Leveling agent T-1

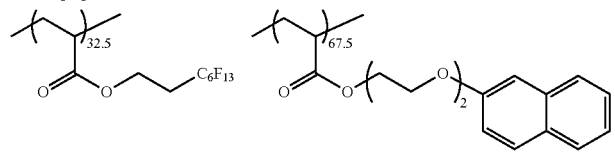

<Formation of Positive C-Plate C-1>

A film C-1 having a positive C-plate C-1 on a temporary support for formation was manufactured by the same method as for the positive C-plate described in paragraph [0124] of JP2015-200861A. It should be noted that the thickness of the positive C-plate was controlled so that Rth(550) was −69 nm.

[Manufacture of Circularly Polarizing Plate 1]

A surface of a TD80UL, (manufactured by FUJIFILM Corporation) which is a support was subjected to an alkali saponification treatment. Specifically, the support was immersed in a 1.5 N aqueous sodium hydroxide solution at 55° C. for 2 minutes, and the extracted support was washed in a water-washing bathtub at room temperature and neutralized with 0.1 N sulfuric acid at 30° C. Thereafter, the obtained support was washed in a water-washing bathtub at room temperature and further dried with a hot air at 100° C.

Subsequently, a roll-shaped polyvinyl alcohol film having a thickness of 80 μm was continuously stretched five times in an iodine aqueous solution, and the stretched film was dried to obtain a polarizer having a thickness of 20 μm.

The obtained polarizer and a support (TD80UL) which had been subjected to an alkali saponification treatment were bonded to each other to obtain a polarizing plate having a polarizer exposed on one side.

Subsequently, the exposed surface of the polarizer in the polarizing plate and the surface of the positive A-plate A-1 in the glass plate A-1 were bonded to each other using a pressure-sensitive adhesive (SK-2057, manufactured by Soken Chemical Co., Ltd.) so that an angle formed between the absorption axis of the polarizer and the slow axis of the positive A-plate A-1 was 45°, and then the glass substrate on the glass plate A-1 was peeled to transfer only the positive A-plate A-1 onto the polarizing plate.

Next, the surface of the transferred positive A-plate A-1 and the surface of the positive C-plate C-1 in the film C-1 manufactured above were bonded to each other using a pressure-sensitive adhesive (SK-2057, manufactured by Soken Chemical Co., Ltd.), and then the temporary support for formation in the film C-1 was peeled to transfer only the positive C-plate C-1 onto the positive A-plate A-1, thereby manufacturing a circularly polarizing plate 1.

Example 2

A positive A-plate A-2 was formed by the same method as in Example 1, except that the composition A-1 was changed to the following composition A-2 and the thickness was adjusted, thereby manufacturing a circularly polarizing plate 2. In addition, the weighted average value of I/O values of the liquid crystal compounds in the following composition A-2 is shown in Table 3 below.

(Composition A-2)

| | |
|---|---|
| The polymerizable liquid crystal compound L-1 | 23.00 parts by mass |
| The polymerizable liquid crystal compound L-2 | 53.00 parts by mass |
| The polymerizable liquid crystal compound L-3 | 24.00 parts by mass |
| The polymerization initiator PI-1 | 0.50 parts by mass |

-continued

| | |
|---|---|
| The leveling agent T-1 | 0.20 parts by mass |
| Chloroform | 570.00 parts by mass |

Example 3

A positive A-plate A-3 was formed by the same method as in Example 1, except that the composition A-1 was changed to the following composition A-3 and the thickness was adjusted, thereby manufacturing a circularly polarizing plate 3. In addition, the weighted average value of I/O values of the liquid crystal compounds in the following composition A-3 is shown in Table 3 below.

(Composition A-3)

| | |
|---|---|
| The polymerizable liquid crystal compound L-1 | 62.00 parts by mass |
| The polymerizable liquid crystal compound L-2 | 20.00 parts by mass |
| The polymerizable liquid crystal compound L-3 | 18.00 parts by mass |
| The polymerization initiator PI-1 | 0.50 parts by mass |
| The leveling agent T-1 | 0.20 parts by mass |
| Chloroform | 570.00 parts by mass |

Example 4

<Synthesis of Polymer PA-1 Having Photo-Alignment Group>

According to the method described for Langmuir, 32(36), 9245-9253 (2016), a monomer m-1 shown below was synthesized using 2-hydroxyethyl methacrylate (HEMA) (a reagent from Tokyo Chemical Industry Co., Ltd.) and the following cinnamic acid chloride derivative.

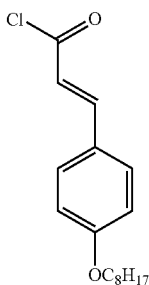

Cinnamic acid chloride derivative

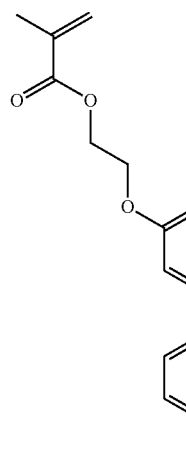

Monomer m-1

5 parts by mass of 2-butanone was introduced as a solvent into a flask equipped with a cooling pipe, a thermometer, and a stirrer, nitrogen was flowed into the flask at 5 mL/min, and the flask was refluxed under heating in a water bath. A solution obtained by mixing 5 parts by mass of the monomer m-1, 5 parts by mass of CYCLOMER M100 (manufactured by Daicel Chemical Industries, Ltd.), 1 part by mass of 2,2'-azobis(isobutyronitrile) as a polymerization initiator, and 5 parts by mass of 2-butanone as a solvent was added dropwise thereto for 3 hours, and the mixture was further stirred for 3 hours while keeping the refluxing state. After completion of the reaction, the mixture was left to be cooled to room temperature and diluted by addition of 30 parts by mass of 2-butanone to obtain an about 20%-by-mass polymer solution. The obtained polymer solution was put into methanol in a large excess to precipitate a polymer, and the recovered precipitate was separated by filtration and washed with a large amount of methanol, and then dried with air blast at 50° C. for 12 hours to obtain a polymer PA-1 having a photo-alignment group.

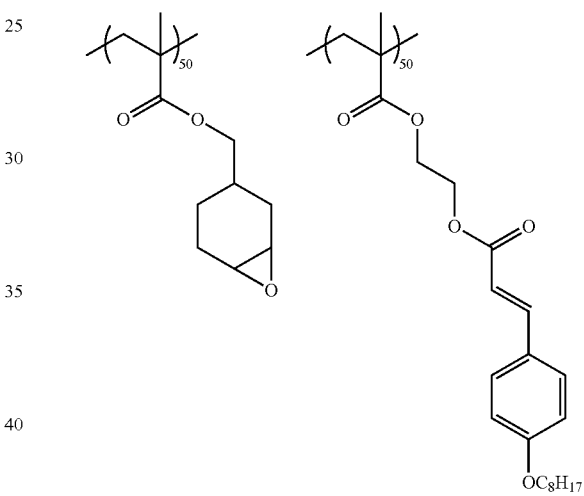

Polymer PA-1

<Manufacture of Alignment Film P-2>

A coating liquid forming an alignment film P-2 was continuously applied onto a commercially available triacetyl cellulose film "Z-TAC" (manufactured by FUJIFILM Corporation) with a #2.4 wire bar. A support having the coating film formed thereon was dried with hot air at 140° C. for 120 seconds, and subsequently irradiated with polarized ultraviolet rays (10 mJ/cm$^2$, using an ultra-high-pressure mercury lamp) to form an alignment film P-2.

(Coating Liquid for Forming Alignment Film P-2)

| | |
|---|---|
| The polymer PA-1 | 100.00 parts by mass |
| Thermal acid generator (San-Aid SI-B3A, manufactured by Sanshin Chemical) | 5.00 parts by mass |
| Isopropyl alcohol | 16.50 parts by mass |
| Butyl acetate | 1,072.00 parts by mass |
| Methyl ethyl ketone | 268.00 parts by mass |

<Formation of Positive A-plate A-4>

The following composition A-4 was applied onto the alignment film P-2 using a bar coater. After the coating film formed on the alignment film P-2 was heated to 120° C. with hot air and then cooled to 60° C., and the coating film was irradiated with ultraviolet rays at 100 mJ/cm² at a wavelength of 365 nm in a nitrogen atmosphere using a high-pressure mercury lamp, and subsequently irradiated with ultraviolet rays at 500 mJ/cm² under heating to 120° C. to fix the alignment of the liquid crystal compound, thereby manufacturing a TAC film A-4 having the positive A-plate A-4. The thickness of the positive A-plate A-4 is shown in Table 3 below. In addition, the weighted average value of I/O values of the liquid crystal compounds in the following composition A-4 is shown in Table 3 below.

(Composition A-4)

| | |
|---|---|
| The polymerizable liquid crystal compound L-1 | 39.00 parts by mass |
| The polymerizable liquid crystal compound L-2 | 39.00 parts by mass |
| The polymerizable liquid crystal compound L-3 | 17.00 parts by mass |
| The following polymerizable liquid crystal compound L-4 | 5.00 parts by mass |
| The polymerization initiator PI-1 | 0.50 parts by mass |
| The leveling agent T-1 | 0.20 parts by mass |
| Cyclopentanone | 235.00 parts by mass |

Polymerizable liquid crystal compound L-4 (I/O value: 0.37)

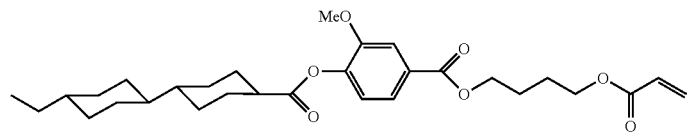 [SMILES: C=CC(=O)OCCCCOC(=O)c1ccc(OC(=O)C2CCC(C3CCC(CC)CC3)CC2)c(OC)c1]

[Manufacture of Circularly Polarizing Plate 4]

A polarizing plate having a polarizer exposed on one side was obtained by the same method as in Example 1.

Subsequently, the exposed surface of the polarizer in the polarizing plate and the surface of the positive A-plate A-4 in the TAC film A-4 were bonded to each other using a pressure-sensitive adhesive (SK-2057, manufactured by Soken Chemical Co., Ltd.) so that an angle formed between the absorption axis of the polarizer and the slow axis of the positive A-plate A-4 was 45°, and then the Z-TAC in the TAC film A-4 was peeled to transfer only the positive A-plate A-4 to the polarizing plate.

Next, the surface of the transferred positive A-plate A-4 and the surface of the positive C-plate C-1 in the film C-1 manufactured above were bonded to each other using a pressure-sensitive adhesive (SK-2057, manufactured by Soken Chemical Co., Ltd.), and then the temporary support for formation in the film C-1 was peeled to transfer only the positive C-plate C-1 onto the positive A-plate A-1, thereby manufacturing a circularly polarizing plate 4.

Example 5

A positive A-plate A-5 was formed by the same method as in Example 1, except that the composition A-1 was changed to the following composition A-5 and the thickness was adjusted, thereby manufacturing a circularly polarizing plate 5. In addition, the weighted average value of I/O values of the liquid crystal compounds in the following composition A-5 is shown in Table 3 below.

(Composition A-5)

| | |
|---|---|
| The following polymerizable liquid crystal compound L-5 | 33.00 parts by mass |
| The polymerizable liquid crystal compound L-2 | 55.00 parts by mass |
| The polymerizable liquid crystal compound L-3 | 12.00 parts by mass |
| The polymerization initiator PI-1 | 0.50 parts by mass |
| The leveling agent T-1 | 0.20 parts by mass |
| Chloroform | 570.00 parts by mass |

Poymerizable liquid crystal compound L-5 (I/O value: 0.40, pKa value: 12.2)

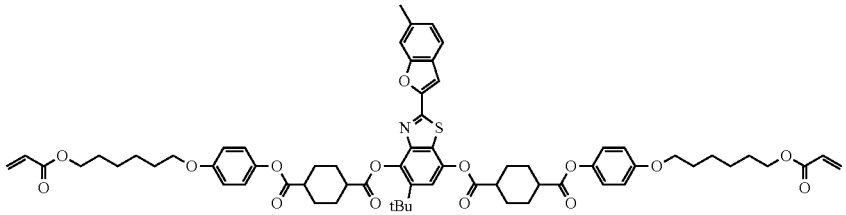 [SMILES: C=CC(=O)OCCCCCCOc1ccc(OC(=O)C2CCC(C(=O)Oc3c(C(C)(C)C)cc(OC(=O)C4CCC(C(=O)Oc5ccc(OCCCCCCOC(=O)C=C)cc5)CC4)c4sc(-c5cc6ccc(C)cc6o5)nc34)CC2)cc1]

Example 6

A positive A-plate A-6 was formed by the same method as in Example 1, except that the composition A-1 was changed to the following composition A-6 and the thickness was adjusted, thereby manufacturing a circularly polarizing plate 6. In addition, the weighted average value of I/O values of the liquid crystal compounds in the following composition A-6 is shown in Table 3 below.

(Composition A-6)

| | |
|---|---|
| The polymerizable liquid crystal compound L-1 | 33.00 parts by mass |
| The following polymerizable liquid crystal compound L-6 | 55.00 parts by mass |
| The polymerizable liquid crystal compound L-3 | 12.00 parts by mass |
| The polymerization initiator PI-1 | 0.50 parts by mass |
| The leveling agent T-1 | 0.20 parts by mass |
| Chloroform | 570.00 parts by mass |

Polymerizable liquid crystal compound L-6 (I-O value: 0.43)

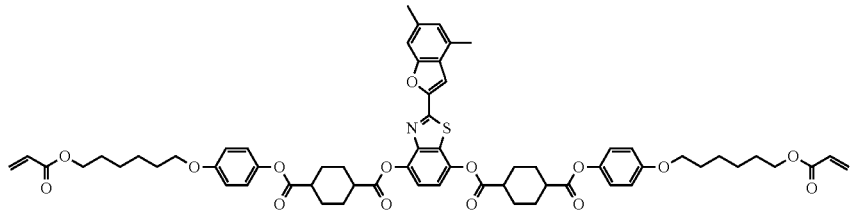 [SMILES: C=CC(=O)OCCCCCCOc1ccc(OC(=O)C2CCC(C(=O)Oc3ccc(OC(=O)C4CCC(C(=O)Oc5ccc(OCCCCCCOC(=O)C=C)cc5)CC4)c4sc(-c5cc6c(C)cc(C)cc6o5)nc34)CC2)cc1]

Example 7

A positive A-plate A-7 was formed by the same method as in Example 1, except that the composition A-1 was changed to the following composition A-7 and the thickness was adjusted, thereby manufacturing a circularly polarizing plate 7. In addition, the weighted average value of I/O values of the liquid crystal compounds in the following composition. A-7 is shown in Table 3 below.
(Composition A-7)

| | |
|---|---|
| The polymerizable liquid crystal compound L-5 | 10.00 parts by mass |
| The polymerizable liquid crystal compound L-6 | 90.00 parts by mass |
| The polymerization initiator PI-1 | 0.50 parts by mass |
| The leveling agent T-1 | 0.20 parts by mass |
| Chloroform | 570.00 parts by mass |

Example 8

A positive A-plate A-8 was formed by the same method as in Example 1, except that the composition A-1 was changed to the following composition A-8 and the thickness was adjusted, thereby manufacturing a circularly polarizing plate 8. In addition, the weighted average value of I/O values of the liquid crystal compounds in the following composition A-8 is shown in Table 3 below.
(Composition A-8)

| | |
|---|---|
| The polymerizable liquid crystal compound L-1 | 78.00 parts by mass |
| The following polymerizable liquid crystal compound L-7 | 22.00 parts by mass |
| The polymerization initiator PI-1 | 0.50 parts by mass |
| The leveling agent T-1 | 0.20 parts by mass |
| Chloroform | 570.00 parts by mass |

Polymerizable liquid crystal compound L-7 (I/O value: 0.41)

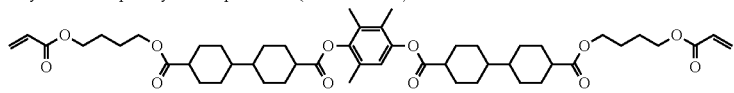

Comparative Example 1

A positive A-plate A-9 was formed by the same method as in Example 1, except that the composition A-1 was changed to the following composition A-9 and the thickness was adjusted, thereby manufacturing a circularly polarizing plate 9. In addition, the weighted average value of I/O values of the liquid crystal compounds in the following composition A-9 is shown in Table 3 below.
(Composition A-9)

| | |
|---|---|
| The polymerizable liquid crystal compound L-1 | 84.00 parts by mass |
| The polymerizable liquid crystal compound L-3 | 16.00 parts by mass |
| The polymerization initiator PI-1 | 0.50 parts by mass |
| The leveling agent T-1 | 0.20 parts by mass |
| Chloroform | 570.00 parts by mass |

Comparative Example 2

A positive A-plate A-10 was formed by the same method as in Example 1, except that the composition A-1 was changed to the following composition A-10 and the thickness was adjusted, thereby manufacturing a circularly polarizing plate 10. In addition, the weighted average value of I/O values of the liquid crystal compounds in the following composition A-10 is shown in Table 3 below.
(Composition A-10)

| | |
|---|---|
| The polymerizable liquid crystal compound L-2 | 73.00 parts by mass |
| The polymerizable liquid crystal compound L-3 | 27.00 parts by mass |
| The polymerization initiator PI-1 | 0.50 parts by mass |

-continued

| | |
|---|---|
| The leveling agent T-1 | 0.20 parts by mass |
| Chloroform | 570.00 parts by mass |

Comparative Example 3

A positive A-plate A-11 was formed by the same method as in Example 1, except that the composition A-1 was changed to the following composition A-11 and the thickness was adjusted, thereby manufacturing a circularly polarizing plate 11. In addition, the weighted average value of I/O values of the liquid crystal compounds in the following composition A-11 is shown in Table 3 below.
(Composition A-11)

| | |
|---|---|
| The polymerizable liquid crystal compound L-1 | 73.00 parts by mass |
| The polymerizable liquid crystal compound L-2 | 10.00 parts by mass |
| The polymerizable liquid crystal compound L-3 | 17.00 parts by mass |
| The polymerization initiator PI-1 | 0.50 parts by mass |
| The leveling agent T-1 | 0.20 parts by mass |
| Chloroform | 570.00 parts by mass |

Comparative Example 4

A positive A-plate A-12 was formed by the same method as in Example 1, except that the composition A-1 was changed to the following composition A-12 and the thickness was adjusted, thereby manufacturing a circularly polarizing plate 12. In addition, the weighted average value of I/O values of the liquid crystal compounds in the following composition A-12 is shown in Table 3 below.
(Composition A-12)

| | |
|---|---|
| The following polymerizable liquid crystal compound L-8 | 18.00 parts by mass |
| The polymerizable liquid crystal compound L-2 | 55.00 parts by mass |
| The polymerizable liquid crystal compound L-3 | 27.00 parts by mass |
| The polymerization initiator PI-1 | 0.50 parts by mass |
| The leveling agent T-1 | 0.20 parts by mass |
| Chloroform | 570.00 parts by mass |

Polymerizable liquid crystal compound L-8 (I/O value: 0.51)

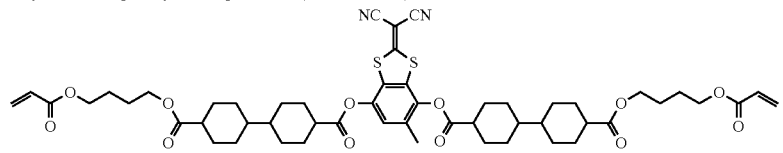

Comparative Example 5

A positive A-plate A-13 was formed by the same method as in Example 1, except that the composition A-1 was changed to the following composition A-13 and the thickness was adjusted, thereby manufacturing a circularly polarizing plate 13. In addition, the weighted average value of I/O values of the liquid crystal compounds in the following composition A-13 is shown in Table 3 below.
(Composition A-13)

| | |
|---|---|
| The following polymerizable liquid crystal compound L-9 | 47.50 parts by mass |
| The following polymerizable liquid crystal compound L-10 | 47.50 parts by mass |
| The polymerizable liquid crystal compound L-3 | 5.00 parts by mass |
| The polymerization initiator PI-1 | 0.50 parts by mass |
| The leveling agent T-1 | 0.20 parts by mass |
| Methyl ethyl ketone | 235.00 parts by mass |

Polymerizable liquid crystal compound L-9 (I/O value: 0.62)

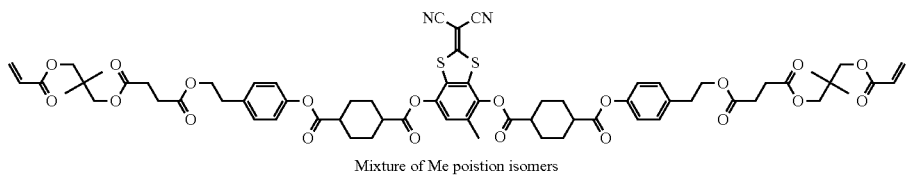 [SMILES: C=CC(=O)OCC(C)(C)COC(=O)CCC(=O)OCCc1ccc(OC(=O)C2CCC(C(=O)Oc3cc(C)c(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Mixture of Me poistion isomers

Polymerizable liquid crystal compound L-10 (I/O value: 0.63)

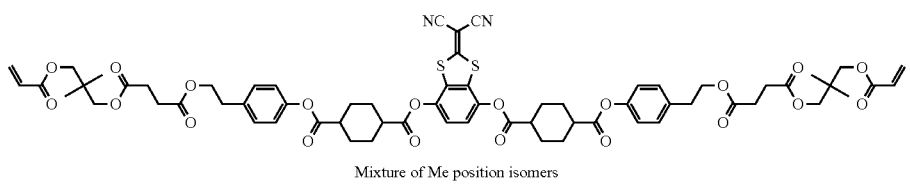 [SMILES: C=CC(=O)OCC(C)(C)COC(=O)CCC(=O)OCCc1ccc(OC(=O)C2CCC(C(=O)Oc3ccc(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Mixture of Me position isomers

Comparative Example 6

A positive A-plate A-14 was formed by the same method as in Example 1, except that the composition A-1 was changed to the following composition A-14 and the thickness was adjusted, thereby manufacturing a circularly polarizing plate 14. In addition, the weighted average value of I/O values of the liquid crystal compounds in the following composition A-14 is shown in Table 3 below.
(Composition A-14)

| | |
|---|---|
| The polymerizable liquid crystal compound L-6 | 95.00 parts by mass |
| The polymerizable liquid crystal compound L-3 | 5.00 parts by mass |
| The polymerization initiator PI-1 | 0.50 parts by mass |
| The leveling agent T-1 | 0.20 parts by mass |
| Chloroform | 570.00 parts by mass |

Comparative Example 7

A positive A-plate A-15 was formed by the same method as in Example 1, except that the composition A-1 was changed to the following composition A-15 and the thickness was adjusted, thereby manufacturing a circularly polarizing plate 15. In addition, the weighted average value of I/O values of the liquid crystal compounds in the following composition A-15 is shown in Table 3 below.
(Composition A-15)

| | |
|---|---|
| The polymerizable liquid crystal compound L-5 | 100.00 parts by mass |
| The polymerization initiator PI-1 | 0.50 parts by mass |
| The leveling agent T-1 | 0.20 parts by mass |
| Chloroform | 570.00 parts by mass |

Various evaluation results shown below for the positive A-plates and the circularly polarizing plates manufactured in Examples 1 to 8 and Comparative Examples 1 to 7 are shown in Table 3 below.

<Measurement of Film Thickness>

The thickness of the positive A-plate was measured using a reflection spectral film thickness meter FE3000 (manufactured by Otsuka Electronics Co., Ltd.).

<Degree of Alignment>

For polarized Raman spectroscopy, an excitation laser wavelength was set to 785 nm and an excitation laser output was set to about 30 mW in a sample part, using a NanoFinder 30 manufactured by Tokyo Instruments, Inc. and an angle q formed by the azimuth of a plane of the optically anisotropic film on which laser polarized light was incident and the electric field direction of the incident laser polarized light was changed from 0 degree to 180 degrees every 15 degrees to perform measurements.

The polarization components (I∥(q)) parallel to the electric field of the incident laser polarized light and the polarization components (I⊥(q)) vertical to the electric field of the incident laser polarized light among the measured scattered light components were each spectrally detected using an analyzer, and for a hand having a peak derived from the molecular skeleton, fitting analysis based on the least squares method was performed using the above-mentioned Theoretical Formula (A) to obtain a degree of alignment.

<Measurement of Optical Characteristics>

The light incidence angle dependence of Re was measured at wavelengths of 450 nm and 550 nm, using AxoScan OPMF-1 (manufactured by Opto Science, Inc.).

<Moisture-Heat Resistance>

After a pressure-sensitive adhesive was bonded onto the manufactured positive A-plate and held for 500 hours in an environment of 85° C. and 85%, Re(550) was evaluated according to the following standard.

A: A case where a ratio of Re(550) after holding at 85° C. and 85% to Re(550) before the holding is 98% or more.

B: A case where a ratio of Re(550) after holding at 85° C. and 85% to Re(550) before the holding is 95% or more and less than 98%.

C: A case where a ratio of Re(550) after holding at 85° C. and 85% to Re(550) before the holding is 90% or more and less than 95%.

D: A case where a ratio of Re(550) after holding at 85° C. and 85% to Re(550) before the holding is less than 90%.

<Reflectivity>

(Mounting in Organic EL Display Device)

GALAXY S IV manufactured by SAMSUNG Co., Ltd., equipped with an organic EL display panel, was disintegrated, the circularly polarizing plate was peeled, and each of the circularly polarizing plates of Examples 1 to 8 and Comparative Examples 1 to 7 was bonded onto the organic EL display panel to manufacture an organic EL display device.

(Reflectivity)

For the manufactured organic EL display device, the measurement was performed in a specular component excluded (SCE) mode using a colorimeter (CM-2022, manufactured by Konica Minolta, Inc.), and the obtained Y value was evaluated according to the following standard using Comparative Example 5 as a reference. In addition, in Table 3 below, the evaluation of Comparative Example 5 as a reference is described as "-".

A: A case where the ratio of the Y value with respect to the Y value in Comparative Example 5 is 110% or less.

B: A case where the ratio of the Y value with respect to the Y value in Comparative Example 5 is more than 110%.

TABLE 3

| | Polymerizable liquid crystal compound (1) | | | Polymerizable liquid crystal compound (2) | | | Weighted average value of I/O values |
|---|---|---|---|---|---|---|---|
| | Type | Substituent Z | van der Waals volume ($10^2$ Å$^3$) | Type | Substituent Z | van der Waals volume ($10^2$Å$^3$) | |
| Example 1 | L-1 | tBu | 0.71 | L-2 | H | 0.06 | 0.50 |
| Example 2 | L-1 | tBu | 0.71 | L-2 | H | 0.06 | 0.50 |
| Example 3 | L-1 | tBu | 0.71 | L-2 | H | 0.06 | 0.49 |
| Example 4 | L-1 | tBu | 0.71 | L-2 | H | 0.06 | 0.47 |
| Example 5 | L-5 | tBu | 0.71 | L-2 | H | 0 06 | 0.48 |
| Example 6 | L-1 | tBu | 0.71 | L-6 | H | 0.06 | 0.46 |
| Example 7 | L-5 | tBu | 0.71 | L-6 | H | 0.06 | 0.43 |
| Example 8 | L-1 | tBu | 0.71 | L-7 | Me | 0.25 | 0.47 |

TABLE 3-continued

| | | | | | | | |
|---|---|---|---|---|---|---|---|
| Comparative Example 1 | L-1 | tBu | 0.71 | — | — | — | 0.49 |
| Comparative Example 2 | — | — | — | L-2 | H | 0.06 | 0.51 |
| Comparative Example 3 | L-1 | tBu | 0.71 | L-2 | H | 0.06 | 0.49 |
| Comparative Example 4 | — | — | — | L-2 | H | 0.06 | 0.51 |
| | | | | L-8 | Me | 0.25 | |
| Comparative Example 5 | — | — | — | L-9 | Me | 0.25 | 0.62 |
| | | | | L-10 | H | 0.06 | |
| Comparative Example 6 | — | — | — | L-6 | H | 0.06 | 0.43 |
| Comparative Example 7 | L-5 | tBu | 0.71 | — | — | — | 0.40 |

| | Thickness d (μm) | Degree of alignment | Re(550) (nm) | Re(450)/ Re(550) | Δn = Re/d | Moisture-heat durability | Reflectivity |
|---|---|---|---|---|---|---|---|
| Example 1 | 2.6 | 0.53 | 144 | 0.87 | 0.056 | A | A |
| Example 2 | 2.3 | 0.60 | 144 | 0.87 | 0.062 | B | A |
| Example 3 | 2.8 | 0.50 | 144 | 0.87 | 0.052 | A | A |
| Example 4 | 2.5 | 0.53 | 144 | 0.87 | 0.058 | A | A |
| Example 5 | 2.7 | 0.42 | 144 | 0.87 | 0.053 | A | A |
| Example 6 | 2.9 | 0.40 | 144 | 0.87 | 0.049 | A | A |
| Example 7 | 2.8 | 0.43 | 144 | 0.87 | 0.052 | C | A |
| Example 8 | 2.8 | 0.42 | 144 | 0.87 | 0.051 | A | A |
| Comparative Example 1 | 3.1 | 0.38 | 144 | 0.87 | 0.046 | A | A |
| Comparative Example 2 | 2.1 | 0.67 | 144 | 0.87 | 0.068 | D | A |
| Comparative Example 3 | 3.1 | 0.38 | 144 | 0.87 | 0.047 | A | A |
| Comparative Example 4 | 2.1 | 0.65 | 144 | 0.87 | 0.068 | D | A |
| Comparative Example 5 | 2.4 | 0.67 | 144 | 0.87 | 0.061 | D | — |
| Comparative Example 6 | 2.6 | 0.45 | 144 | 0.87 | 0.055 | D | A |
| Comparative Example 7 | 3.0 | 0.22 | 144 | 0.91 | 0.048 | A | A |

From the results shown in Table 3 above, it was found that in a case where the polymerizable liquid crystal compound (2) was not blended, the degree of alignment of the optically anisotropic film was lowered and a thickness of 3 μm or more was required to realize a desired phase difference (Comparative Examples 1 and 7).

Furthermore, it was found that in a case where the polymerizable liquid crystal compound (1) was not blended, the moisture-heat resistance of the optically anisotropic film was deteriorated (Comparative Examples 2 and 4 to 6).

In addition, it was found that even in a case where the polymerizable liquid crystal compound (1) and the polymerizable liquid crystal compound (2) were blended, a thickness of 3 μm or more was required to realize a desired phase difference with the degree of alignment of the optically anisotropic film being small (Comparative Example 3).

In contrast, it was found that in a case where the polymerizable liquid crystal compound (1) and the polymerizable liquid crystal compound (2) were blended and the degree of alignment of the optically anisotropic film was 0.4 or more, a thickness required to obtain excellent moisture-heat resistance and realize a phase difference suitable for antireflection was less than 3 μm (Examples 1 to 8).

Explanation of References 10 optically anisotropic film
12 positive A-plate
14 positive C-plate
16 circularly polarizing plate
18 polarizer
20 organic EL display device
22 organic EL display panel

What is claimed is:

1. An optically anisotropic film obtained by polymerizing a polymerizable liquid crystal composition,
wherein the polymerizable liquid crystal composition contains a polymerizable liquid crystal compound represented by Formula (1) and a polymerizable liquid crystal compound represented by Formula (2), and
the optically anisotropic film satisfies Formula (3) or (4) and has a degree of alignment of 0.4 or more as measured by Raman spectroscopy, $$L^1\text{-}SP^1\text{-}(E^3\text{-}A^1)_m\text{-}E^1\text{-}G^1\text{-}D^1\text{-}Ar^1\text{-}D^2\text{-}G^2\text{-}E^2\text{-}(A^2\text{-}E^4)_n\text{-}SP^2\text{-}L^2 \quad (1)$$

$$L^1\text{-}SP^1\text{-}(E^3\text{-}A^1)_m\text{-}E^1\text{-}G^1\text{-}D^1\text{-}Ar^2\text{-}D^2\text{-}G^2\text{-}E^2\text{-}(A^2\text{-}E^4)_n\text{-}SP^2\text{-}L^2 \quad (2)$$

$$Re(450)/Re(550) < 1 \quad (3)$$

$$Rth(450)/Rth(550) < 1 \quad (4)$$

in Formulae (1) and (2), $D^1$, $D^2$, $E^1$, $E^2$, $E^3$, and $E^4$ each independently represent a single bond, —CO—O—, —C(=S)O—, —CR$^1$R$^2$—, —CR$^1$R$^2$—CR$^3$R$^4$—, —O—CR$^1$R$^2$—, —CR$^1$R$^2$—O—CR$^3$R$^4$—, —CO—O—CR$^1$R$^2$—, —O—CO—CR$^1$R$^2$—, —CR$^1$R$^2$—O—CO—CR$^3$R$^4$—, —CR$^1$R$^2$—CO—O—CR$^3$R$^4$—, —NR$^1$—CR$^2$R$^3$—, or —CO—NR$^1$—, where $R^1$, $R^2$, R³, and R⁴ each independently represent a hydrogen atom, a fluorine atom, or an alkyl group having 1 to 4 carbon atoms, G¹ and G² each independently represent a divalent alicyclic hydrocarbon group having 5 to 8 carbon atoms, which may have a substituent, and one or more of —CH₂—'s constituting the alicyclic hydrocarbon group may be substituted with —O—, —S—, or —NH, A¹ and A² each independently represent a divalent aromatic hydrocarbon group having 6 to 12 carbon atoms or a divalent alicyclic hydrocarbon group having 5 to 8 carbon atoms, each of which may have a substituent, and one or more of —CH₂—'s constituting the alicyclic hydrocarbon group may be substituted with —O—, —S—, or —NH—, SP¹ and SP² each independently represent a single bond, a linear or branched alkylene group having 1 to 12 carbon atoms, or a divalent linking group in which one or more of —CH₂—'s constituting the linear or branched alkylene group having 1 to 12 carbon atoms are substituted with —O—, —S—, —NH—, —N(Q)-, or —CO—, and Q represents a substituent, L¹ and L² each independently represent a monovalent organic group, and at least one of L¹ or L² represents a polymerizable group, provided that in a case where Ar¹ or Ar² is an aromatic ring represented by Formula (Ar-3), at least one of L¹ or L², or L³ or L⁴ in Formula (Ar-3) represents a polymerizable group, m represents an integer of 0 to 2, and in a case where m is 2, a plurality of E³'s may be the same as or different from each other and a plurality of A¹'s may be the same as or different from each other, n represents an integer of 0 to 2, and in a case where n is 2, a plurality of E⁴'s may be the same as or different from each other and a plurality of A²'s may be the same as or different from each other, and Ar¹ represents any aromatic ring selected from the group consisting of the groups represented by Formulae (Ar-1) to (Ar-5), and Ar² represents any aromatic ring selected from the group consisting of the groups represented by Formulae (Ar-1) to (Ar-6), (Ar-1)

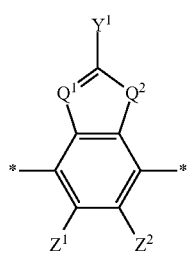

(Ar-2)

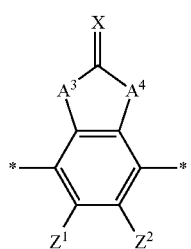

(Ar-3)

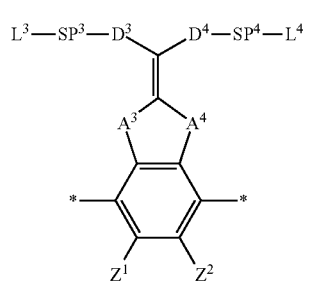

(Ar-4)

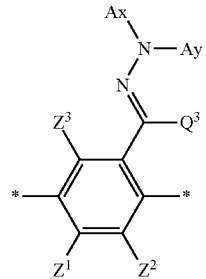

(Ar-5)

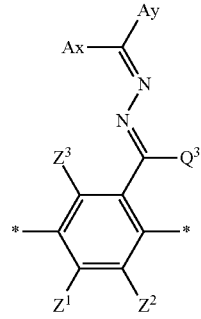

(Ar-6)

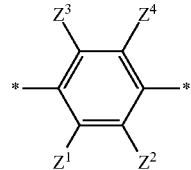

in Formulae (Ar-1) to (Ar-6), * represents a bonding position to D¹ or D²,

Q¹ represents N or CH,

Q² represents —S—, —O—, or —N(R⁵)—, where R⁵ represents a hydrogen atom or an alkyl group having 1 to 6 carbon atoms, Y¹ represents an aromatic hydrocarbon group having 6 to 12 carbon atoms or an aromatic heterocyclic group having 3 to 12 carbon atoms, each of which may have a substituent, Z¹, Z², Z³, Z⁴ and each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —OR⁶, —NR⁷R⁸, or —SR⁹, R⁶ to R⁹ each independently represent a hydrogen atom or an alkyl group having 1 to 6 carbon atoms, and Z¹ and Z² may be bonded to each other to form an aromatic ring, provided that at least one of Z¹ or Z² in Ar¹ represents a group having a van der Waals volume of $0.3 \times 10^2$ Å³ or more, and $Z^1$, $Z^2$, $Z^3$, and $Z^4$ in $Ar^2$ each represent a group having a van der Waals volume of less than $0.3 \times 10^2$ Å$^3$, $A^3$ and $A^4$ each independently represent a group selected from the group consisting of —O—, —N($R^{10}$)—, —S—, and —CO—, where $R^{10}$ represents a hydrogen atom or a substituent, X represents a non-metal atom of Groups XIV to XVI to which a hydrogen atom or a substituent may be bonded, $D^3$ and $D^4$ each independently represent a single bond, —CO—O—, —C(=S)O—, —$CR^1R^2$—, —$CR^1R^2$—$CR^3R^4$—, —O—$CR^1R^2$—, —$CR^1R^2$—O—$CR^3R^4$—, —CO—O—$CR^1R^2$—, —O—CO—$CR^1R^2$—, —$CR^1R^2$—O—CO—$CR^3R^4$—, —$CR^1R^2$—CO—O—$CR^3R^4$—, —$NR^1$—$CR^2R^3$—, or —CO—$NR^1$—, where $R^1$, $R^2$, $R^3$, and $R^4$ each independently represent a hydrogen atom, a fluorine atom, or an alkyl group having 1 to 4 carbon atoms, $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent, $L^3$ and $L^4$ each independently represent a monovalent organic group, and at least one of $L^3$ or $L^4$, or $L^1$ or $L^2$ in Formula (1) or (2) represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, $Q^3$ represents a hydrogen atom, or an alkyl group having 1 to 6 carbon atoms, which may have a substituent, in Formula (3), Re(450) represents an in-plane retardation of the optically anisotropic film at a wavelength of 450 nm, and Re(550) represents an in-plane retardation of the optically anisotropic film at a wavelength of 550 nm, and in Formula (4), Rth(450) represents a thickness-direction retardation of the optically anisotropic film at a wavelength of 450 nm, and Rth(550) represents a thickness-direction retardation of the optically anisotropic film at a wavelength of 550 nm.

2. The optically anisotropic film according to claim 1, wherein in Formula (1), m is 1, $A^1$ and $G^1$ are both a cyclohexylene group which may have a substituent, and $E^1$ is a single bond, and in Formula (1), n is 1, $A^2$ and $G^2$ are both a cyclohexylene group which may have a substituent, and $E^2$ is a single bond.

3. The optically anisotropic film according to claim 1, wherein $Ar^1$ in Formula (1) and $Ar^2$ in Formula (2) both represent a group represented by Formula (Ar-1) or (Ar-2).

4. The optically anisotropic film according to claim 1, wherein the total number of the rings represented by $G^1$, $G^2$, $A^1$, and $A^2$ in Formula (1) is the same as the total number of the rings represented by $G^1$, $G^2$, $A^1$, and $A^2$ in Formula (2).

5. The optically anisotropic film according to claim 1, wherein an I/O value of the liquid crystal compound included in the polymerizable liquid crystal composition is 0.51 or less as a weighted average value.

6. The optically anisotropic film according to claim 1, wherein the polymerizable liquid crystal composition does not correspond to any of Formulae (1) and (2) and contains a polymerizable compound having two or more polymerizable groups.

7. The optically anisotropic film according to claim 1, wherein the polymerizable liquid crystal composition contains a polymerization initiator.

8. The optically anisotropic film according to claim 7, wherein the polymerization initiator is an oxime-type polymerization initiator.

9. The optically anisotropic film according to claim 1, wherein the optically anisotropic film is a positive A-plate or a positive C-plate.

10. The optically anisotropic film according to claim 1, wherein the optically anisotropic film is a positive A-plate and has an Re(550) of 100 to 180 nm.

11. An optical film comprising the optically anisotropic film according to claim 1.

12. A polarizing plate comprising:
the optical film according to claim 11; and
a polarizer.

13. An image display device comprising the optical film according to claim 11.

14. An image display device comprising the polarizing plate according to claim 12.

15. The optically anisotropic film according to claim 2, wherein $Ar^1$ in Formula (1) and $Ar^2$ in Formula (2) both represent a group represented by Formula (Ar-1) or (Ar-2).

16. An optical film comprising the optically anisotropic film according to claim 2.

17. A polarizing plate comprising:
the optical film according to claim 16; and
a polarizer.

18. An image display device comprising the optical film according to claim 16.

19. An image display device comprising the polarizing plate according to claim 17.

* * * * *